(12) United States Patent
Murachi et al.

(10) Patent No.: US 10,331,049 B2
(45) Date of Patent: Jun. 25, 2019

(54) SUBSTRATE CLEANING DEVICE AND SUBSTRATE PROCESSING APPARATUS INCLUDING THE SAME

(71) Applicant: SCREEN HOLDINGS CO., LTD., Kyoto (JP)

(72) Inventors: Hiromi Murachi, Kyoto (JP); Ryuichi Yoshida, Kyoto (JP); Koji Nishiyama, Kyoto (JP); Toru Momma, Kyoto (JP); Chikara Sagae, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/691,929

(22) Filed: Aug. 31, 2017

(65) Prior Publication Data
US 2018/0067407 A1   Mar. 8, 2018

(30) Foreign Application Priority Data
Sep. 5, 2016   (JP) .................................. 2016-172672

(51) Int. Cl.
*G03F 7/20*   (2006.01)
*H01L 21/67*   (2006.01)

(52) U.S. Cl.
CPC .... *G03F 7/70975* (2013.01); *H01L 21/67046* (2013.01); *H01L 21/67051* (2013.01)

(58) Field of Classification Search
CPC ........... G03F 7/70975; H01L 21/67046; H01L 21/67051; H04L 61/2514; H04L 61/2517; H04L 61/2521; H04L 69/22
See application file for complete search history.

(56) References Cited

U.S. PATENT DOCUMENTS 5,651,160 A * 7/1997 Yonemizu ............... B08B 1/007
134/902
5,927,305 A * 7/1999 Shiba ........................ B08B 3/02
134/144

(Continued)

FOREIGN PATENT DOCUMENTS

JP    10-303157 A    11/1998
JP     3756284 B2     3/2006

(Continued)

OTHER PUBLICATIONS

Office Action dated Jan. 21, 2019 issued in counterpart Korean Patent Application No. 10-2017-0111729.

*Primary Examiner* — Deoram Persaud
(74) *Attorney, Agent, or Firm* — Ostrolenk Faber LLP

(57) ABSTRACT

A substrate cleaning device includes a cleaning brush having a circular upper end surface, and cleans a lower surface of a substrate by bringing the upper end surface of the cleaning brush into contact with the lower surface of the substrate rotated by a spin chuck. A space forming member is provided for cleaning of the cleaning brush. The space forming member has a lower end surface. Further, the space forming member has a circular opening in a lower end surface and forms an inner space. A cleaning liquid is supplied to the inner space of the space forming member with the circular opening closed by the upper end surface of the cleaning brush, whereby the cleaning liquid is allowed to flow out from the inner space through the circular opening and a gap between the upper end surface of the cleaning brush and the lower end surface of the space forming member.

7 Claims, 18 Drawing Sheets

(56) References Cited

U.S. PATENT DOCUMENTS

| | | | |
|---|---|---|---|
| 6,276,378 B1* | 8/2001 | Taniyama | H01L 21/67046 134/153 |
| 6,418,584 B1* | 7/2002 | Teeny | B08B 1/00 15/102 |
| 8,027,017 B2* | 9/2011 | Ryu | B08B 1/007 134/1.3 |
| 9,211,568 B2 | 12/2015 | Chang | 15/1.51 |
| 9,460,941 B2* | 10/2016 | Nishiyama | H01L 21/6704 |
| 9,623,450 B2* | 4/2017 | Nishiyama | B08B 3/04 |
| 10,086,495 B2* | 10/2018 | Shinozaki | B24B 53/017 |
| 2002/0157692 A1* | 10/2002 | Ishihara | B08B 1/04 134/134 |
| 2002/0195128 A1* | 12/2002 | Shibagaki | H01L 21/67051 134/26 |
| 2006/0213536 A1* | 9/2006 | Sato | H01L 21/67046 134/6 |
| 2006/0219260 A1* | 10/2006 | Iwami | H01L 21/67046 134/6 |
| 2007/0089767 A1* | 4/2007 | Yamamoto | B08B 3/02 134/149 |
| 2007/0226926 A1* | 10/2007 | Hiraoka | B08B 1/04 15/102 |
| 2007/0251035 A1* | 11/2007 | Peng | A46B 17/06 15/77 |
| 2009/0120472 A1 | 5/2009 | Nishiyama et al. | 134/157 |
| 2009/0173364 A1* | 7/2009 | Hamada | H01L 21/67051 134/30 |
| 2011/0030737 A1* | 2/2011 | Amano | H01L 21/67051 134/32 |
| 2012/0285484 A1* | 11/2012 | Liu | B08B 1/00 134/6 |
| 2013/0112224 A1* | 5/2013 | Nakaharada | H01L 21/67046 134/18 |
| 2013/0192634 A1* | 8/2013 | Huang | A46B 15/0018 134/6 |
| 2014/0261537 A1 | 9/2014 | Chang | 134/6 |
| 2015/0179484 A1 | 6/2015 | Ishibashi | |
| 2016/0059380 A1* | 3/2016 | Yamaguchi | B24B 53/017 451/56 |
| 2016/0236239 A1 | 8/2016 | Nishiyama | |
| 2017/0250096 A1* | 8/2017 | Wang | H01L 21/67046 |
| 2018/0078973 A1* | 3/2018 | Yano | A46B 5/0025 |
| 2018/0151343 A1* | 5/2018 | Takiguchi | H01L 21/67046 |
| 2018/0261474 A1* | 9/2018 | Hokaku | H01L 21/67046 |

FOREIGN PATENT DOCUMENTS

| | | |
|---|---|---|
| JP | 2009-123800 A | 6/2009 |
| JP | 2015-019024 A | 1/2015 |
| KR | 10-2015-0075366 A | 7/2015 |
| KR | 10-2016-0100839 A | 8/2016 |

* cited by examiner

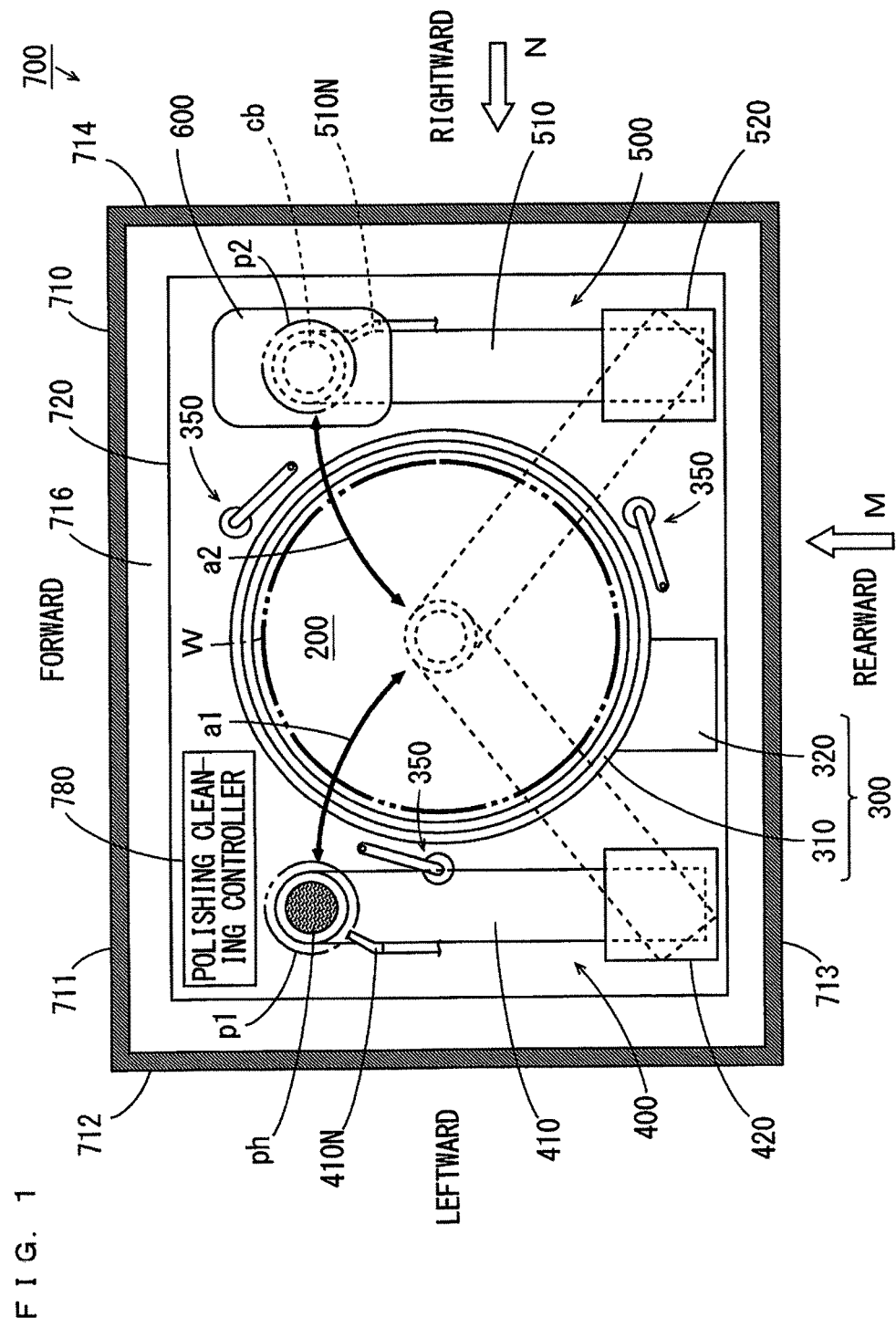

F I G. 3
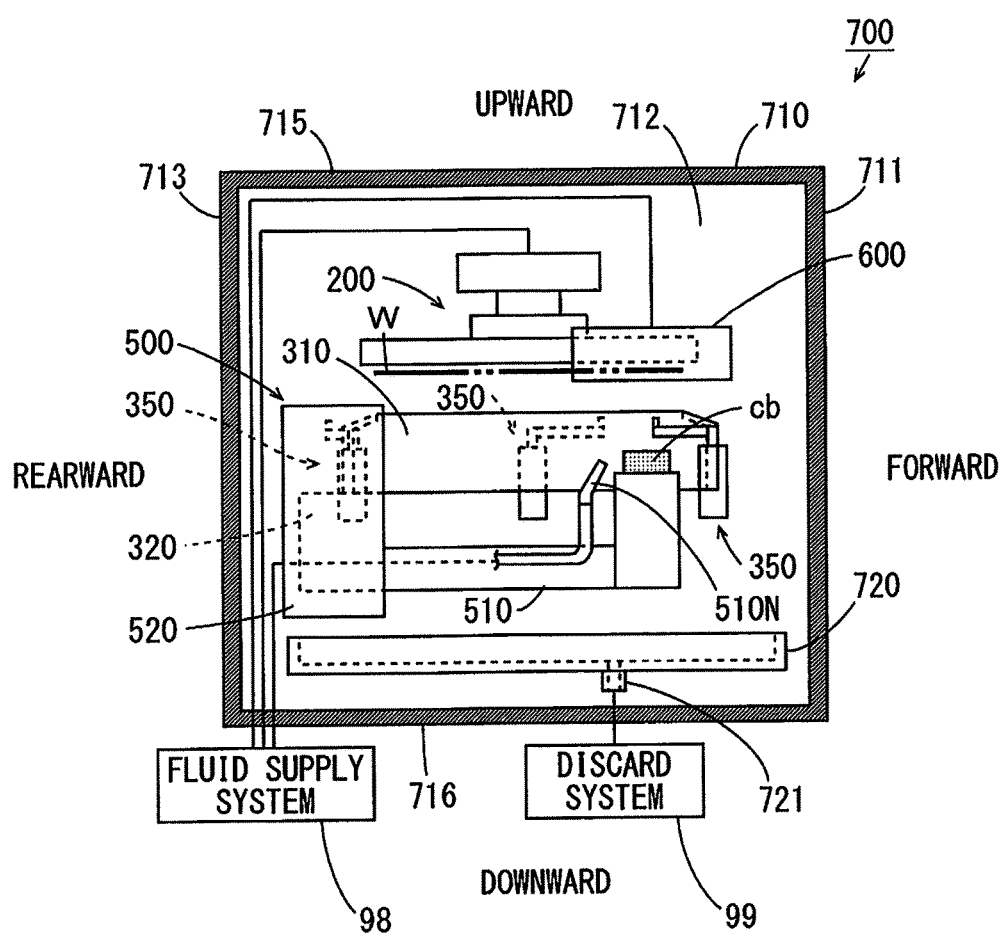

F I G. 1 3
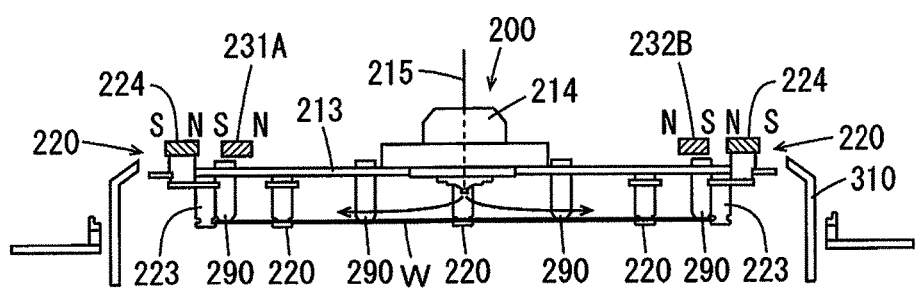
F I G. 1 4
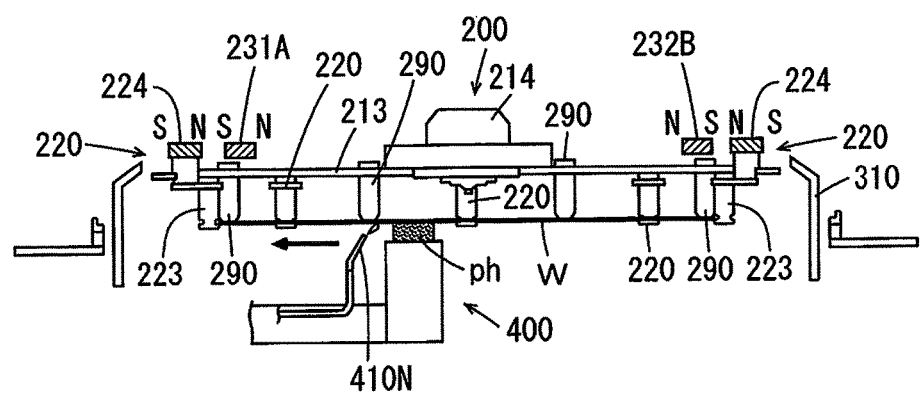

SUBSTRATE CLEANING DEVICE AND SUBSTRATE PROCESSING APPARATUS INCLUDING THE SAME

BACKGROUND OF THE INVENTION

Field of the Invention

The present invention relates to a substrate cleaning device that cleans a substrate and a substrate processing apparatus including the substrate cleaning device.

Description of Related Art

In a lithography process in manufacturing of a semiconductor device and the like, a coating film is formed by supply of a coating liquid such as a resist liquid onto a substrate. The coating film is exposed to exposure light and then developed, so that a predetermined pattern is formed on the coating film. Cleaning processing is performed on the substrate of which the coating film has not been exposed (see JP 2009-123800 A, for example).

In JP 2009-123800 A, a substrate processing apparatus having a cleaning drying processing unit is described. In the cleaning drying processing unit, the substrate is rotated while being horizontally held by a spin chuck. In this state, particles and the like adhering to a surface of the substrate are cleaned away by supply of a cleaning liquid to an upper surface of the substrate. Further, contaminants adhering to an entire lower surface and an outer peripheral end of the substrate are removed by cleaning of the entire lower surface and the outer peripheral end of the substrate by the cleaning liquid and a cleaning brush.

BRIEF SUMMARY OF THE INVENTION

In order to realize an even finer pattern to be formed on the substrate, even higher cleanliness of the lower surface of the substrate is required. However, contaminants that have been removed from the substrate sometimes remain in the surface or the inside of the cleaning brush. Even if the cleaning liquid is supplied towards the cleaning brush, the contaminants remaining in the cleaning brush cannot be easily cleaned away. When the lower surface of the substrate is cleaned by the cleaning brush in which the contaminants remain, the contaminants adhere to the lower surface of the substrate again.

An object of the present invention is to provide a substrate cleaning device capable of removing contaminants adhering to a lower surface of a substrate and reducing re-adherence of the removed contaminants to the substrate, and a substrate processing apparatus including the substrate cleaning device.

(1) A substrate cleaning device according to one aspect of the present invention that cleans a lower surface of a substrate includes a rotation holder that holds and rotates the substrate in a horizontal attitude, a lower surface cleaning mechanism that includes a cleaner having a circular upper end surface and cleans the lower surface of the substrate by bringing the upper end surface of the cleaner into contact with the lower surface of the substrate rotated by the rotation holder, and a cleaner cleaning mechanism that cleans the cleaner, wherein the cleaner cleaning mechanism includes a space forming member that has a lower end surface, has a circular opening in the lower end surface and forms an inner space, and a cleaning liquid supply system that allows a cleaning liquid to flow out from the inner space through the circular opening and a gap between the upper end surface of the cleaner and the lower end surface of the space forming member by supplying the cleaning liquid to the inner space of the space forming member with the circular opening of the space forming member closed by the upper end surface of the cleaner.

In this substrate cleaning device, the upper end surface of the cleaner comes into contact with the lower surface of the substrate rotated by the rotation holder, so that the lower surface of the substrate is cleaned. At this time, the contaminants adhering to the lower surface of the substrate are mainly stripped by the outer peripheral end of the upper end surface of the cleaner. Therefore, the contaminants that have been removed from the lower surface of the substrate are likely to remain in the outer peripheral end of the upper end surface of the cleaner. Then, the cleaner is cleaned by the cleaner cleaning mechanism.

In the above-mentioned cleaner cleaning mechanism, with the circular opening of the space forming member closed by the upper end surface of the cleaner, the cleaning liquid is supplied to the inner space of the space forming member. The cleaning liquid that has been supplied to the inner space flows out to the outside of the space forming member through the circular opening and a gap between the upper end surface of the cleaner and the lower end surface of the space forming member from the inner space. Thus, the contaminants remaining in the outer peripheral end of the upper end surface of the cleaner are cleaned away together with the cleaning liquid that flows out from the inner space of the space forming member.

As a result, the contaminants adhering to the lower surface of the substrate can be removed, and re-adherence of the removed contaminants to the substrate is reduced.

(2) The lower end surface of the space forming member may be inclined downward and outward from an inner edge of the circular opening.

With such a configuration, the cleaning liquid smoothly flows obliquely downward and outward from the inner edge of the circular opening along the shape of the lower end surface of the space forming member. Thus, the cleaning liquid that flows out from the inner space of the space forming member is inhibited from splashing over a wide range.

(3) The substrate cleaning device may further include a cleaner rotator that rotates the cleaner relative to the space forming member about a vertical axis passing through the upper end surface with the circular opening of the space forming member closed by the upper end surface of the cleaner.

In this case, the contaminants remaining in the upper end surface of the cleaner are stripped by the lower end surface of the space forming member by the rotation of the cleaner during the cleaning of the cleaner. Further, a flow of the cleaning liquid that rotates about the vertical axis is generated in the inner space of the space forming member, and a centrifugal force is exerted on the cleaning liquid that flows out from the space forming member. Thus, the contaminants stripped by the lower end surface of the space forming member are smoothly removed by the cleaning liquid that flows out from the inner space of the space forming member.

(4) The substrate cleaning device may further include a relative mover that moves the cleaner relative to the space forming member such that the upper end surface of the cleaner closes the circular opening of the space forming member. Thus, the cleaner can be appropriately positioned during the cleaning of the cleaner.

(5) The cleaner cleaning mechanism may be provided at a waiting position outward of the substrate rotated by the rotation holder, and the relative mover, during cleaning of the lower surface of the substrate, may be configured to be capable of moving the cleaner between a cleaning position at which the upper end surface of the cleaner faces the lower surface of the substrate rotated by the rotation holder and the waiting position, and may be configured to be capable of moving the cleaner relative to the substrate rotated by the rotation holder such that the upper end surface of the cleaner comes into contact with the lower surface of the substrate rotated by the rotation holder at the cleaning position.

In this case, it is not necessary to independently provide a configuration for performing the positioning operation of the cleaner during the cleaning of the cleaner and a configuration for performing the positioning operation of the cleaner during the cleaning of the lower surface of the substrate. Therefore, it is possible to inhibit increases in number and size of components of the substrate cleaning device.

(6) The substrate cleaning device may further include a lower surface polishing mechanism that includes a polisher and polishes the lower surface of the substrate by bringing the polisher into contact with the lower surface of the substrate rotated by the rotation holder, wherein the lower surface cleaning mechanism may clean the lower surface of the substrate after polishing of the lower surface of the substrate by the lower surface polishing mechanism.

In this case, it is possible to remove the contaminants firmly adhering to the lower surface of the substrate by polishing the lower surface of the substrate. Further, the lower surface of the substrate is cleaned after the polishing of the lower surface of the substrate, whereby contaminants generated by the polishing of the lower surface of the substrate are removed. Therefore, the cleanliness of the lower surface of the substrate can be more sufficiently improved.

(7) A substrate processing apparatus according to another aspect of the present invention arranged to be adjacent to an exposure device includes a coating device that applies a photosensitive film to an upper surface of a substrate, the above-mentioned substrate cleaning device, and a transport device that transports the substrate among the coating device, the substrate cleaning device and the exposure device, wherein the substrate cleaning device cleans a lower surface of the substrate before exposure processing for the substrate by the exposure device.

In the substrate processing apparatus, the lower surface of the substrate on which the exposure processing has not been performed is cleaned by the above-mentioned substrate cleaning device. The above-mentioned cleaning device enables the contaminants adhering to the lower surface of the substrate to be removed, and enables the re-adherence of the removed contaminants to the substrate to be reduced. Therefore, the cleanliness of the lower surface of the substrate during the exposure processing is improved. As a result, an occurrence of a processing defect of the substrate due to the contamination of the lower surface of the substrate is inhibited.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 1 is a schematic plan view showing a schematic configuration of a substrate cleaning device according to one embodiment of the present invention;

FIG. 3 is a schematic side view of the substrate cleaning device of FIG. 1 as viewed in a direction of an outlined arrow N;

FIG. 13 is a side view for explaining cleaning of an upper surface of the substrate;

FIG. 14 is a side view for explaining polishing of a lower surface of the substrate;

DESCRIPTION OF THE PREFERRED EMBODIMENTS

A substrate cleaning device and a substrate processing apparatus including the substrate cleaning device according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, in the present embodiment, an upper surface of the substrate refers to as a surface of the substrate directed upward, and a lower surface of the substrate refers to a surface directed downward.

(1) Substrate Cleaning Device

Figure 2:
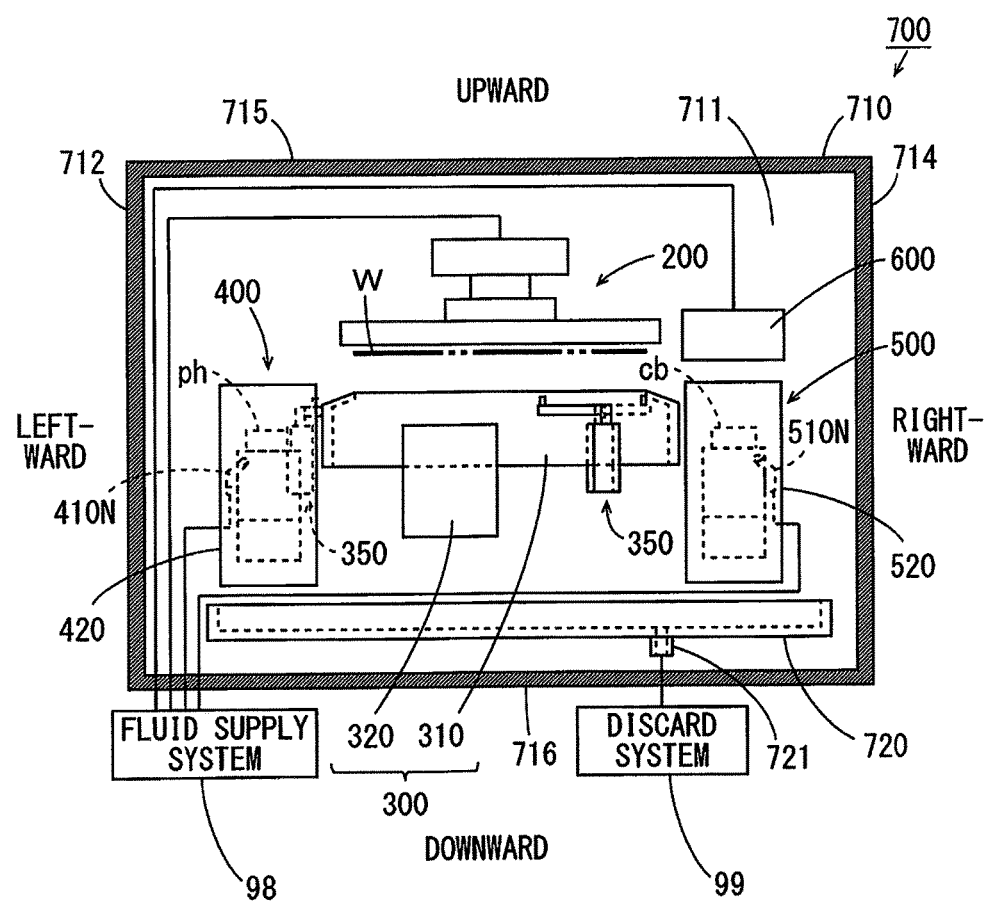
FIG. 2 is a schematic side view of the substrate cleaning device of FIG. 1 as viewed in a direction of an outlined arrow M.

FIG. 1 is a schematic plan view showing a schematic configuration of the substrate cleaning device according to one embodiment of the present invention, FIG. 2 is a schematic side view of the substrate cleaning device 700 of FIG. 1 as viewed in a direction of an outlined arrow M, and FIG. 3 is a schematic side view of the substrate cleaning device 700 of FIG. 1 as viewed in a direction of an outlined arrow N.

As shown in FIGS. 1 to 3, the substrate cleaning device 700 includes a spin chuck 200, a guard mechanism 300, a plurality (three in the present example) of receiving transferring mechanisms 350, a substrate polishing mechanism 400, a substrate cleaning mechanism 500, a brush cleaning mechanism 600, a casing 710, a liquid receiving vat 720 and a polishing cleaning controller 780. In each of FIGS. 2 and 3, the polishing cleaning controller 780 is not shown.

The casing 710 has four sidewalls 711, 712, 713, 714 (FIG. 1), a ceiling portion 715 (FIG. 2) and a bottom surface portion 716 (FIG. 2). The sidewalls 711, 713 are opposite to each other, and the sidewalls 712, 714 are opposite to each other. In the sidewall 711, an opening (not shown) for allowing the substrate W to be carried in and carried out between the inside and the outside of the casing 710 is formed. The ceiling portion 715 is not shown in FIG. 1, the sidewall 713 is not shown in FIG. 2, and the sidewall 714 is not shown in FIG. 3.

In the following description, a direction directed from the inside of the casing 710 towards the outside of the casing 710 through the sidewall 711 is referred to as forward of the substrate cleaning device 700, and a direction directed from the inside of the casing 710 towards the outside of the casing 710 through the sidewall 713 is referred to as rearward of the substrate cleaning device 700. Further, a direction directed from the inside of the casing 710 towards the outside of the casing 710 through the sidewall 712 is referred to as leftward of the substrate cleaning device 700, and a direction directed from the inside of the casing 710 towards the outside of the casing 710 through the sidewall 714 is referred to as rightward of the substrate cleaning device 700.

The spin chuck 200 is provided at a position above a center portion inside of the casing 710. The spin chuck 200 holds and rotates the substrate W in a horizontal attitude. In each of FIGS. 1 to 3, the substrate W held by the spin chuck 200 is indicated by a thick two-dots and dash line. As shown in each of FIGS. 2 and 3, the spin chuck 200 is connected to a fluid supply system 98 through a pipe. The fluid supply system 98 includes a pipe, a valve, a flowmeter, a regulator, a pump, a temperature adjustor and the like, and can supply a cleaning liquid to a below-mentioned liquid supply pipe 215 (FIG. 8) of the spin chuck 200.

The guard mechanism 300 and the three receiving transferring mechanisms 350 are provided below the spin chuck 200 to surround a space below the spin chuck 200. The guard mechanism 300 includes a guard 310 and a guard lifting lowering driver 320. Details of the spin chuck 200, the guard mechanism 300 and the three receiving transferring mechanisms 350 will be described below.

The substrate polishing mechanism 400 is provided at a position further leftward than the guard mechanism 300 and the plurality of receiving transferring mechanisms 350. The substrate polishing mechanism 400 includes an arm 410 and an arm support post 420. The arm support post 420 extends in an up-and-down direction in the vicinity of the sidewall 713. The arm 410 extends in a horizontal direction from the arm support post 420 with its one end supported inside of the arm support post 420 to be liftable, lowerable and rotatable.

A polishing head ph for polishing the lower surface of the substrate W held by the spin chuck 200 is attached to the other end of the arm 410. The polishing head ph is columnar and formed of a PVA (polyvinyl alcohol) sponge in which abrasive grains are dispersed, for example. A driving system (not shown) for rotating the polishing head ph about its central axis is provided inside of the arm 410.

A nozzle 410N is attached to a portion of the arm 410 in the vicinity of the polishing head ph. As shown in FIG. 2, the nozzle 410N is connected to the fluid supply system 98 through a pipe. The fluid supply system 98 can supply a cleaning liquid to the nozzle 410N. In the present embodiment, pure water is used as the cleaning liquid. A discharge port of the nozzle 410N is directed towards the vicinity of an upper end surface (a polishing surface) of the polishing head ph.

With the lower surface of the substrate W not polished, the arm 410 is supported by the arm support post 420 to extend in a front-and-rear direction of the substrate cleaning device 700. At this time, the polishing head ph is located outward of the substrate W held by the spin chuck 200. In this manner, a position at which the polishing head ph is arranged with the arm 410 extending in the front-and-rear direction is referred to as a head waiting position p1. The head waiting position p1 is indicated by a two-dots and dash line in FIG. 1.

During polishing of the lower surface of the substrate W, the arm 410 is rotated about the arm support post 420. Thus, as indicated by a thick arrow a1 in FIG. 1, at a height lower than the substrate W, the polishing head ph is moved between a position opposite to a center of the substrate W held by the spin chuck 200 and the head waiting position p1. Further, the height of the arm 410 is adjusted such that the upper end surface (the polishing surface) of the polishing head ph comes into contact with the lower surface of the substrate W.

The substrate cleaning mechanism 500 is provided at a position further rightward than the guard mechanism 300 and the plurality of receiving transferring mechanisms 350. The substrate cleaning mechanism 500 includes an arm 510 and an arm support post 520. The arm support post 520 extends in the up-and-down direction in the vicinity of the sidewall 713. The arm 510 extends in the horizontal direction from the arm support post 520 with its one end supported inside of the arm support post 520 to be liftable, lowerable and rotatable.

A cleaning brush cb for cleaning the lower surface of the substrate W held by the spin chuck 200 is attached to the other end of the arm 510. The cleaning brush cb is columnar and formed of a PVA sponge, for example. A driving system (see FIG. 4, described below) for rotating the cleaning brush cb about its central axis is provided inside of the arm 510. In the present example, an outer diameter of the cleaning brush cb is equal to an outer diameter of the polishing head ph. The outer diameter of the cleaning brush cb and the outer diameter of the polishing head ph may be set different from each other.

A nozzle 510N is attached to a portion of the arm 510 in the vicinity of the cleaning brush cb. As shown in FIGS. 2 and 3, the nozzle 510N is connected to the fluid supply system 98 through a pipe. The fluid supply system 98 can supply a cleaning liquid to the nozzle 510N. A discharge port of the nozzle 510N is directed towards the vicinity of an upper end surface (a cleaning surface) of the cleaning brush cb.

With the lower surface of the substrate W not cleaned, the arm 510 is supported by the arm support post 520 to extend in the front-and-rear direction of the substrate cleaning device 700. At this time, the cleaning brush cb is located outward of the substrate W held by the spin chuck 200. In this manner, a position at which the cleaning brush cb is arranged with the arm 510 extending in the front-and-rear direction is referred to as a brush waiting position p2. The brush waiting position p2 is indicated by a two-dots and dash line in FIG. 1.

During the cleaning of the lower surface of the substrate W, the arm 510 is rotated about the arm support post 520. Thus, as indicated by a thick arrow a2 in FIG. 1, at a height lower than the substrate W, the cleaning brush cb is moved between a position opposite to the center of the substrate W held by the spin chuck 200 and the brush waiting position p2. Further, the height of the arm 510 is adjusted such that the upper end surface (the cleaning surface) of the cleaning brush cb comes into contact with the lower surface of the substrate W.

The brush cleaning mechanism 600 is provided at a position further upward than the substrate cleaning mechanism 500 and further rightward than the spin chuck 200 to be opposite to the cleaning brush cb arranged at the brush waiting position p2. The brush cleaning mechanism 600 is connected to the fluid supply system 98 through a pipe. The fluid supply system 98 can supply a cleaning liquid to the brush cleaning mechanism 600. In the brush cleaning mechanism 600, the cleaning brush cb of the substrate cleaning mechanism 500 is cleaned. The details of the brush cleaning mechanism 600 are described below.

The liquid receiving vat 720 is provided on the bottom surface portion 716 of the substrate cleaning device 700 to be located below the spin chuck 200, the guard mechanism 300, the plurality of receiving transferring mechanisms 350, the substrate polishing mechanism 400, the substrate cleaning mechanism 500 and the brush cleaning mechanism 600. The liquid receiving vat 720 receives the cleaning liquid that falls from each part in the casing 710. As shown in FIGS. 2 and 3, a liquid discard portion 721 is provided at the liquid receiving vat 720. The liquid discard portion 721 is connected to a discard system 99 through a pipe.

The polishing cleaning controller 780 includes a CPU (Central Processing Unit), a ROM (Read Only Memory), a RAM (Random Access Memory) and the like. A control program is stored in the ROM. The CPU controls an operation of each part of the substrate cleaning device 700 by executing the control program stored in the ROM using the RAM.

(2) Details of Substrate Polishing Mechanism and Substrate Cleaning Mechanism

The substrate polishing mechanism 400 and the substrate cleaning mechanism 500 of FIGS. 1 to 3 basically have the same configuration except that the different members (the polishing head ph and the cleaning brush cb) are respectively provided at the other ends of the arms 410, 510. Thus, the configuration of the substrate cleaning mechanism 500 is described as a representative of the substrate polishing mechanism 400 and the substrate cleaning mechanism 500.

Figure 4:
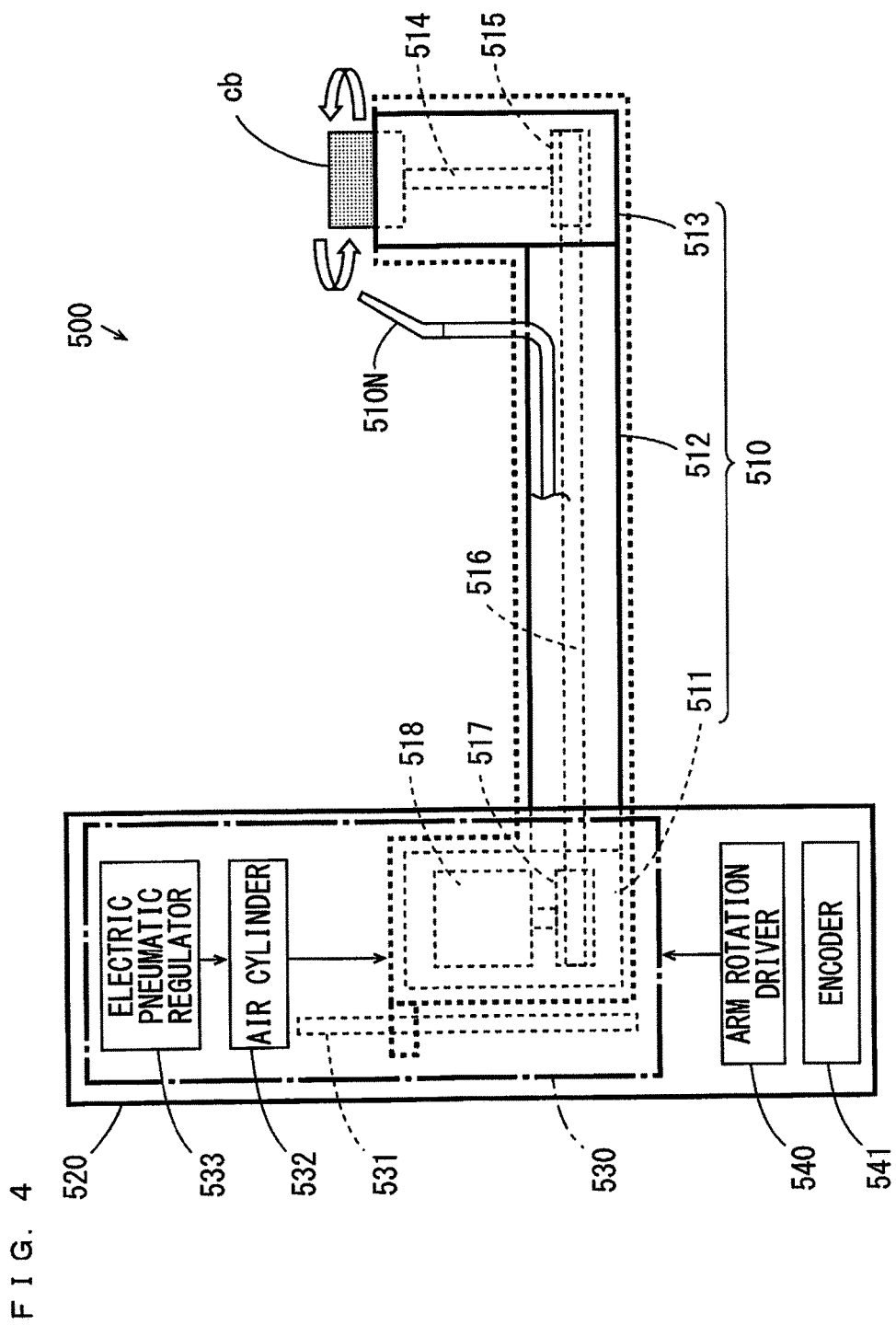
FIG. 4 is a schematic side view showing the configuration of a substrate cleaning mechanism of FIGS. 1 to 3.

FIG. 4 is a schematic side view showing the configuration of the substrate cleaning mechanism 500 of FIGS. 1 to 3. As shown in FIG. 4, the arm 510 includes a one arm end 511, an arm main body 512 and another arm end 513 that are integrally connected to one another. An arm lifting lowering driver 530 that supports the one arm end 511 of the arm 510 such that the one arm end 511 is liftable and lowerable is provided inside of the arm support post 520. Further, an arm rotation driver 540 that rotatably supports the arm 510 and the arm lifting lowering driver 530 about a central axis of the arm support post 520 is provided inside of the arm support post 520.

A pulley 517 and a motor 518 are provided inside of the one arm end 511. The pulley 517 is connected to a rotation shaft of the motor 518. Further, a rotation support shaft 514 and a pulley 515 are provided inside of the other arm end 513. The cleaning brush cb is attached to an upper end of the rotation support shaft 514. The pulley 515 is attached to a lower end of the rotation support shaft 514. Further, a belt 516 that connects the two pulleys 515, 517 to each other is provided inside of the arm main body 512. When the motor 518 is operated based on the control of the polishing cleaning controller 780 of FIG. 1, a rotational force of the motor 518 is transmitted to the cleaning brush cb via the pulley 517, the belt 516, the pulley 515 and the rotation support shaft 514. Thus, the cleaning brush cb is rotated.

The arm lifting lowering driver 530 includes a linear guide 531 extending in a vertical direction, an air cylinder 532 and an electric pneumatic regulator 533. The one arm end 511 is attached to the linear guide 531 to be liftable and lowerable. In this state, the one arm end 511 is connected to the air cylinder 532.

The air cylinder 532 is provided to be extendible and contractible in the vertical direction by the supply of air through the electric pneumatic regulator 533. The electric pneumatic regulator 533 is an electrical control type regulator controlled by the polishing cleaning controller 780 of FIG. 1. The length of the air cylinder 532 changes according to a pressure of the air supplied to the air cylinder 532 from the electric pneumatic regulator 533. Thus, the one arm end 511 is moved to a height corresponding to the length of the air cylinder 532.

The arm rotation driver 540 includes a motor and a plurality of gears, for example, and is controlled by the polishing cleaning controller 780 of FIG. 1. The arm support post 520 is further provided with an encoder 541 for detecting a rotation angle of the arm 510. The encoder 541 detects the rotation angle of the arm 510 with respect to a direction in which the arm 510 extends when the cleaning brush cb is located at the brush waiting position p2 and supplies a signal indicating a result of detection to the polishing cleaning controller 780 of FIG. 1. Thus, the rotation angle of the arm 510 is controlled by feedback control.

(3) Details of Brush Cleaning Mechanism

In the case where the lower surface of the substrate W is cleaned by the upper end surface of the columnar cleaning brush cb, contaminants adhering to the lower surface of the substrate W are mainly stripped by an outer peripheral end of the upper end surface of the cleaning brush cb. Therefore, contaminants that have been removed from the lower surface of the substrate W are likely to remain at the outer peripheral end of the upper end surface of the cleaning brush cb. Then, the cleaning brush cb is cleaned by the brush cleaning mechanism 600.

Figure 5:
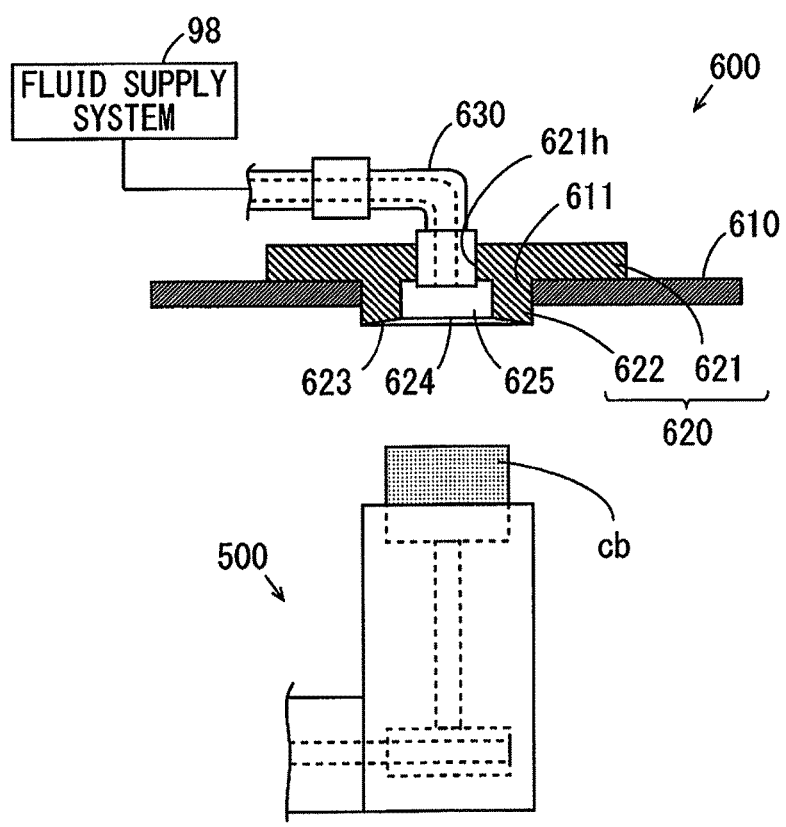
FIG. 5 is a longitudinal cross sectional view of a brush cleaner of FIG. 1.

FIG. 5 is a longitudinal cross sectional view of the brush cleaning mechanism 600 of FIG. 1. In FIG. 5, part of the configuration of the substrate cleaning mechanism 500 of FIG. 4 is shown together with a longitudinal cross sectional view of the brush cleaning mechanism 600. As shown in FIG. 5, the brush cleaning mechanism 600 includes a support plate 610, a space forming member 620 and a cleaning liquid introduction pipe 630. A circular through hole 611 is formed in the support plate 610.

The space forming member 620 includes a disc portion 621 and a cylinder portion 622. A through hole 621h is formed in a center portion of the disc portion 621. The cylinder portion 622 is formed to extend downward from a portion, surrounding the through hole 621*h*, of a lower surface of the disc portion 621. An inner space 625 is formed inward of the cylinder portion 622. The inner space 625 has a circular opening 624 at its lower end. The cylinder portion 622 has an annular lower end surface 623 forming the circular opening 624. In the example of FIG. 5, the lower end surface 623 of the cylinder portion 622 is inclined downward and outward from an inner edge of the circular opening 624.

An inner diameter of the cylinder portion 622 is set smaller than an outer diameter of the cleaning brush cb. For example, in the case where the outer diameter of the cleaning brush cb is 20 mm, the inner diameter of the cylinder portion 622 is set to about 12 mm. Further, an outer diameter of the cylinder portion 622 is set larger than an outer diameter of the cleaning brush cb and smaller than an inner diameter of the through hole 611 of the support plate 610.

The cylinder portion 622 of the space forming member 620 is fitted into the through hole 611 of the support plate 610 and connected to the support plate 610. The support plate 610 and the space forming member 620 are arranged such that the lower end surface 623 of the cylinder portion 622 is opposite to the upper end surface of the cleaning brush cb with the cleaning brush cb of the substrate cleaning mechanism 500 located at the brush waiting position p2 of FIG. 1.

One end of the cleaning liquid introduction pipe 630 is connected to the through hole 621*h* formed in the disc portion 621 of the space forming member 620. In this state, an inner space of the cleaning liquid introduction pipe 630 and the inner space 625 of the space forming member 620 communicate with each other. The other end of the cleaning liquid introduction pipe 630 is connected to the fluid supply system 98 through a pipe. The fluid supply system 98 can supply the cleaning liquid to the inner space 625 of the space forming member 620 through the pipe and the cleaning liquid introduction pipe 630.

Figure 6A:
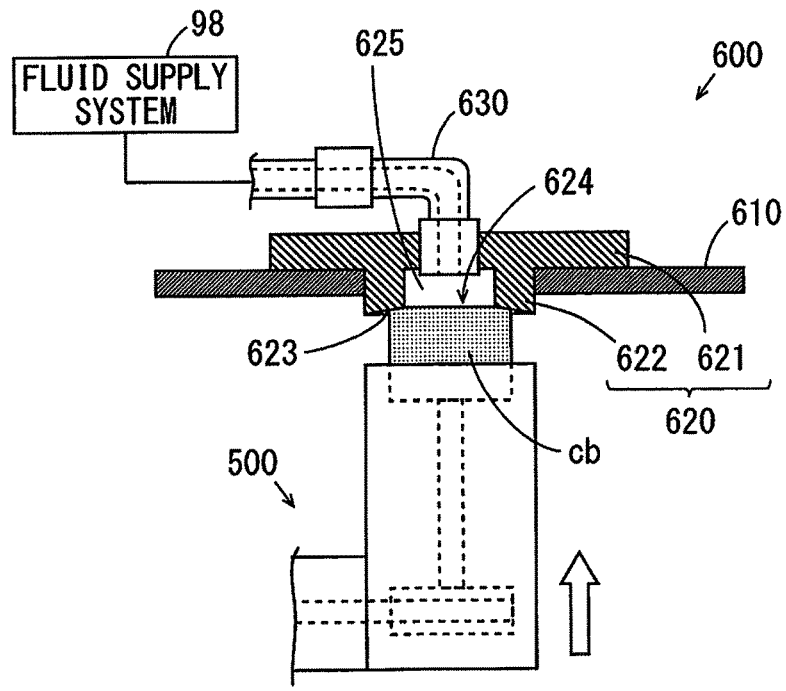
FIGS. 6A and 6B are longitudinal cross sectional views of the brush cleaner for explaining a cleaning operation of a cleaning brush.
Figure 6B:
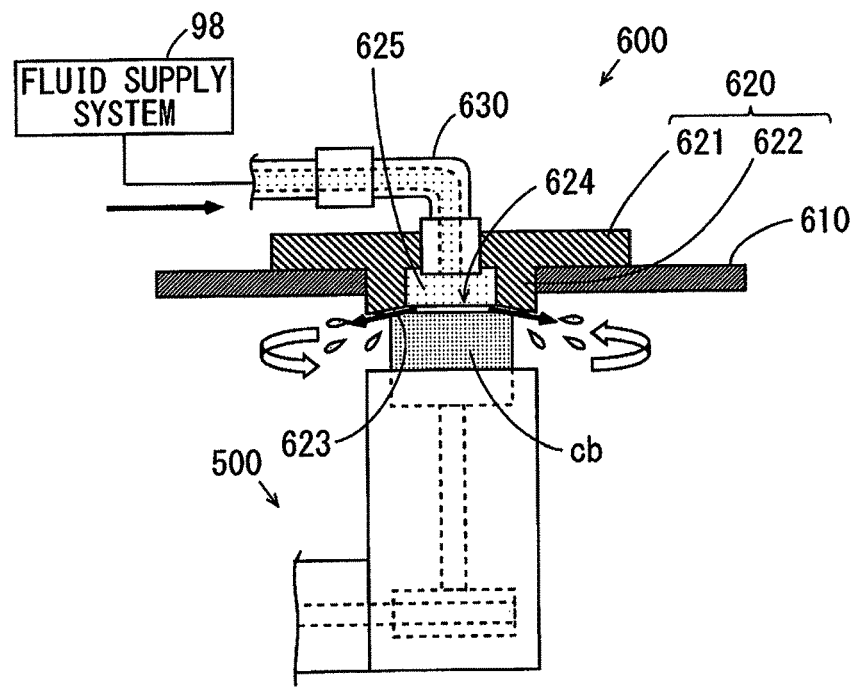

FIGS. 6A and 6B are longitudinal cross sectional views of the brush cleaning mechanism 600 for explaining a cleaning operation of the cleaning brush cb. Before the cleaning of the cleaning brush cb, the cleaning brush cb is arranged at the brush waiting position p2 of FIG. 1 in advance. At this time, the lower end surface 623 of the cylinder portion 622 of the space forming member 620 faces the outer peripheral end of the upper end surface of the cleaning brush cb.

As indicated by an outlined arrow in FIG. 6A, when the cleaning brush cb is cleaned, the cleaning brush cb is moved upward such that the upper end surface of the cleaning brush cb closes the circular opening 624 of the space forming member 620. Further, the cleaning brush cb is moved upward and positioned such that the outer peripheral end of the upper end surface of the cleaning brush cb comes into contact with the lower end surface 623 of the cylinder portion 622. Further, the cleaning brush cb pushes the lower end surface 623 at a predetermined pressure. The predetermined pressure may be 0.

Subsequently, as indicated by a thick solid arrow in FIG. 6B, the cleaning liquid (pure water) is supplied to the inner space 625 of the space forming member 620 through the pipe and the cleaning liquid introduction pipe 630 from the fluid supply system 98. Further, as indicated by outlined arrows in FIG. 6B, the cleaning brush cb rotates about its central axis.

As described above, the cleaning brush cb is elastic because of being formed of the PVA sponge. When the cleaning liquid is supplied into the inner space 625, the cleaning liquid in the inner space 625 flows out to the outside of the space forming member 620 through a position between the upper end surface of the cleaning brush cb and the lower end surface 623 of the space forming member 620 from the circular opening 624 of the space forming member 620. Thus, contaminants remaining at the outer peripheral end of the upper end surface of the cleaning brush cb are cleaned away together with the cleaning liquid that flows out from the inner space 625 of the space forming member 620. The cleaning liquid that has flowed out is received by the liquid receiving vat 720 of FIG. 1 together with the contaminants and sent to the discard system 99 of FIG. 2.

Thus, the contaminants that have been removed from the lower surface of the substrate W are prevented from adhering to the cleaning brush cb again, and the cleanliness of the cleaned cleaning brush cb is improved. As a result, the contaminants adhering to the lower surface of the substrate W can be removed, and the re-adherence of the removed contaminants to the substrate W is reduced.

In the above-mentioned example, during the cleaning of the cleaning brush cb, because the cleaning brush cb is rotated with the circular opening 624 of the cylinder portion 622 closed by the upper end surface of the cleaning brush cb, contaminants remaining at the upper end surface of the cleaning brush cb are scraped by the lower end surface 623 of the space forming member 620. Further, a flow of the cleaning liquid that is rotated about a vertical axis together with the rotation of the cleaning brush cb is generated in the inner space 625 of the space forming member 620. Therefore, a centrifugal force is exerted on the cleaning liquid that flows out from the inner space 625 of the space forming member 620. Thus, the contaminants that have been scraped by the lower end surface 623 of the space forming member 620 are smoothly removed by the cleaning liquid that flows out from the inner space 625 of the space forming member 620.

The cleaning brush cb does not have to be rotated during the cleaning of the cleaning brush cb. In this case, the configuration, for rotating the cleaning brush cb, provided inside of the arm 510 of the substrate cleaning mechanism 500 of FIG. 4 becomes unnecessary. Therefore, the configuration of the substrate cleaning mechanism 500 is simplified.

In the examples of FIGS. 5, 6A and 6B, the lower end surface 623 of the cylinder portion 622 is inclined downward and outward from the inner edge of the circular opening 624. With such a configuration, the cleaning liquid smoothly and obliquely flows downward and outward from the inner edge of the circular opening 624 along the shape of the lower end surface 623 of the cylinder portion 622 during the cleaning of the cleaning brush cb. Thus, the cleaning liquid that flows out from the inner space 625 of the space forming member 620 is prevented from splashing over a wide range.

The lower end surface 623 of the cylinder portion 622 may be formed to be orthogonal to a central axis of the cylinder portion 622 with no inclination. In this case, during fabrication of the space forming member 620, the lower end surface 623 of the cylinder portion 622 is easily formed.

The cleaning brush cb is preferably cleaned at at least one time point, of a time point preceding a start time point of polishing of the lower surface of the substrate W by a predetermined time period (several seconds before, for example), a time point preceding a start time point of cleaning of the lower surface of the substrate W by a predetermined time period (several seconds before, for example) and a time point succeeding a finish time point of the cleaning of the lower surface of the substrate W by a predetermined time period (several seconds later, for example). Further, the cleaning brush cb may be repeatedly cleaned in a predetermined period (one hour, for example) during the operation of the substrate cleaning device 700.

In the above-mentioned configuration, the lower end surface 623 of the cylinder portion 622 is formed to be flat and smooth. In this case, the upper end surface of the cleaning brush cb is inhibited from wearing during the cleaning of the cleaning brush cb. Thus, a reduction of the useful life of the cleaning brush cb due to the cleaning of the cleaning brush cb is inhibited.

In the case where the cleaning brush cb is formed of a material having an excellent wear resistant material, irregularities may be formed on the lower end surface 623 of the cylinder portion 622. In this case, the outer peripheral end of the upper end surface of the cleaning brush cb comes into contact with the irregularities of the lower end surface 623 of the cylinder portion 622, whereby contaminants remaining at the upper end surface of the cleaning brush cb are more efficiently scraped.

Figure 7:
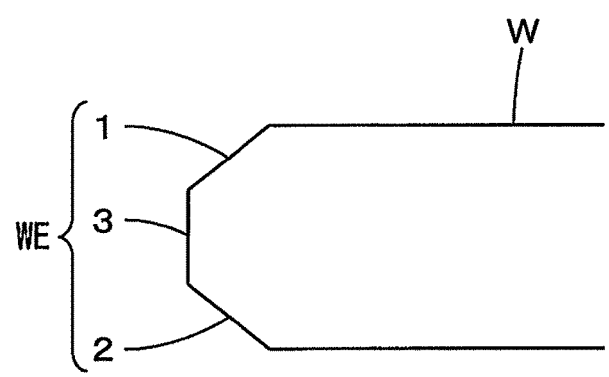
FIG. 7 is an enlarged side view showing the structure of an outer peripheral end of the substrate.

(4) Details of Spin Chuck, Guard Mechanism and Plurality of Substrate Receiving Transferring Mechanisms First, the structure of the outer peripheral end of the substrate W held by the spin chuck 200 of FIG. 1 will be described. FIG. 7 is an enlarged side view showing the structure of the outer peripheral end of the substrate W. As shown in FIG. 7, the outer peripheral end WE of the substrate W includes a bevel portion 1 on the upper surface side, a bevel portion 2 on the lower surface side and an end surface 3. In the following description, the peripheral portion of the lower surface of the substrate W means a region that extends inward from the bevel portion 2 of the substrate W by a predetermined width, and the width is smaller than an outer diameter of each of the polishing head ph and the cleaning brush cb.

Figure 8:
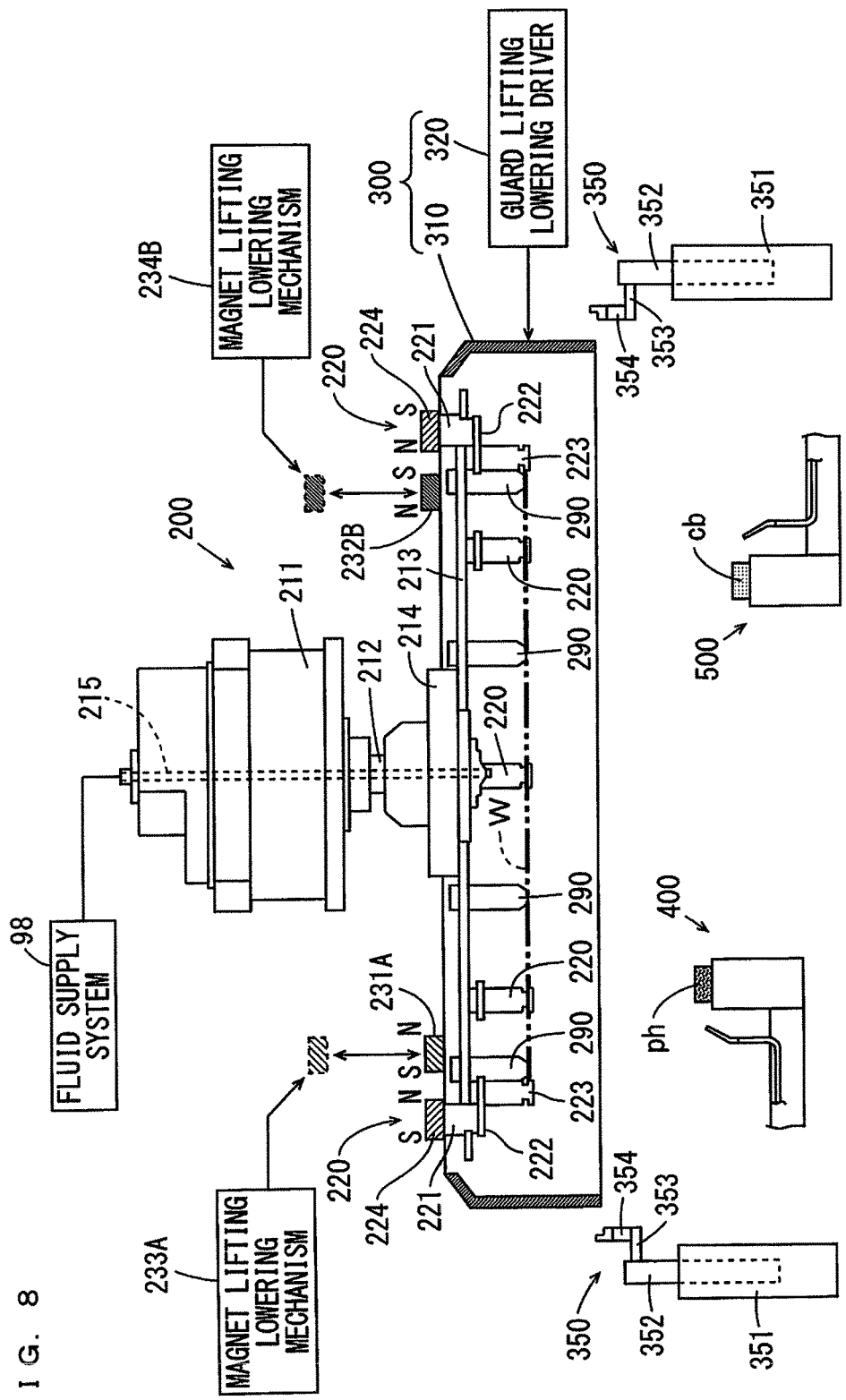
FIG. 8 is a schematic side view for explaining a configuration of a spin chuck and its peripheral members of FIG. 1.
Figure 9:
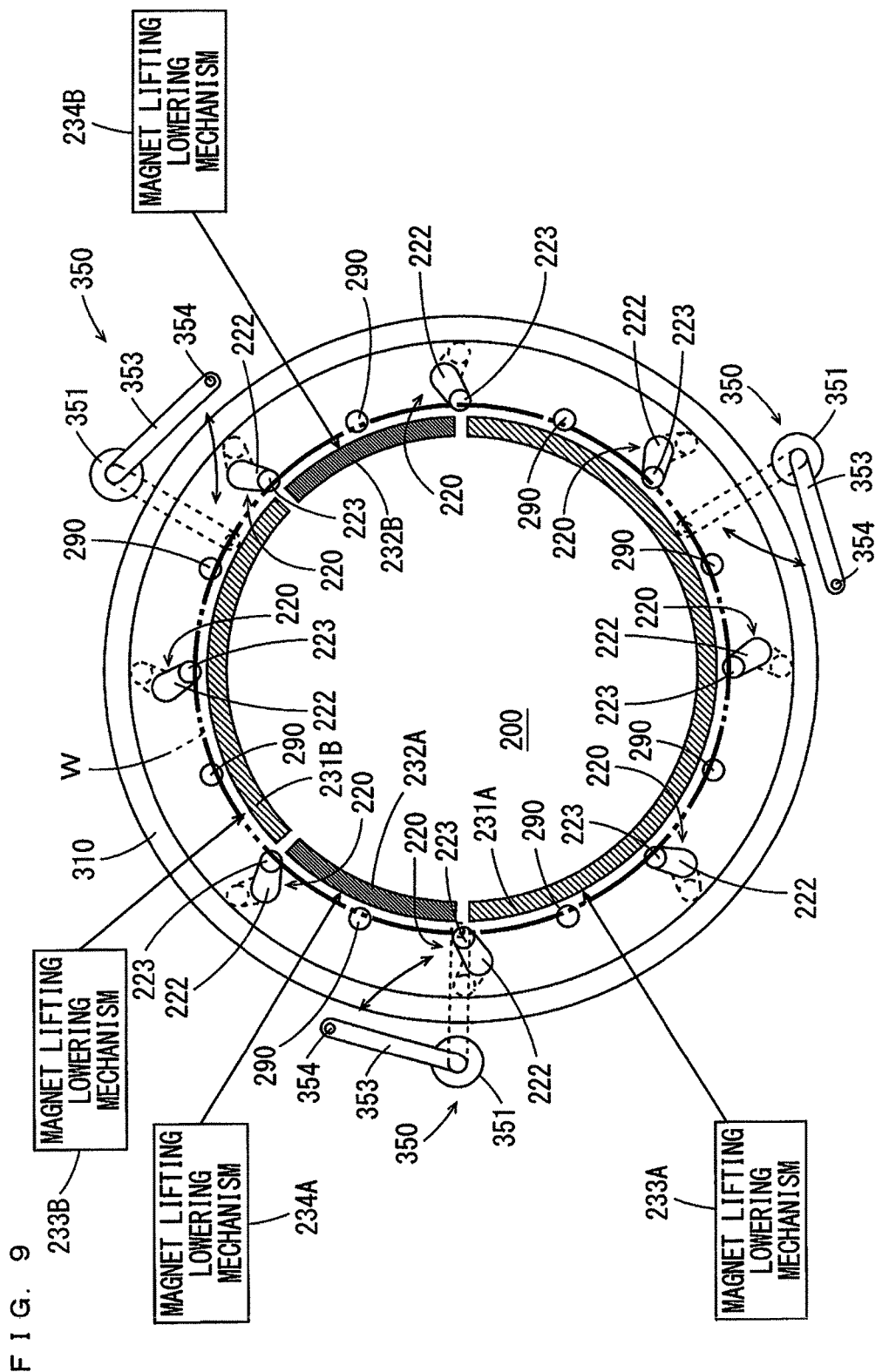
FIG. 9 is a schematic plan view for explaining the configuration of the spin chuck and its peripheral members.

FIG. 8 is a schematic side view for explaining a configuration of the spin chuck 200 and its peripheral members of FIG. 1, and FIG. 9 is a schematic plan view for explaining the configuration of the spin chuck 200 and its peripheral members. In each of FIGS. 8 and 9, the substrate W held by the spin chuck 200 is indicated by a thick two-dots and dash line.

As shown in FIGS. 8 and 9, the spin chuck 200 includes a spin motor 211, a disc-shape spin plate 213, a plate support member 214, four magnet plates 231A, 231B, 232A, 232B (FIG. 9), four magnet lifting lowering mechanisms 233A, 233B, 234A, 234B (FIG. 9), a plurality of chuck pins 220 and a plurality of auxiliary pins 290.

The spin motor 211 is supported at a position slightly above the center inside of the casing 710 of FIG. 1 by a support member (not shown). The spin motor 211 has a rotation shaft 212 that extends downward. The plate support member 214 is attached to the lower end of the rotation shaft 212. The spin plate 213 is horizontally supported by the plate support member 214. The rotation shaft 212 is rotated by an operation of the spin motor 211, and the spin plate 213 is rotated about a vertical axis.

The liquid supply pipe 215 is inserted into the rotation shaft 212 and the plate support member 214. One end of the liquid supply pipe 215 projects downward from the lower end of the plate support member 214. The other end of the liquid supply pipe 215 is connected to the fluid supply system 98 through the pipe. The cleaning liquid is discharged onto the upper surface of the substrate W held by the spin chuck 200 from the fluid supply system 98 through the liquid supply pipe 215.

The plurality of chuck pins 220 are provided at the peripheral portion of the spin plate 213 at equal angular intervals with respect to the rotation shaft 212. In the present example, the eight chuck pins 220 are provided at the peripheral portion of the spin plate 213 at angular intervals of 45 degrees with respect to the rotation shaft 212. Each chuck pin 220 includes a shaft portion 221, a pin supporter 222, a holder 223 and a magnet 224.

The shaft portion 221 is provided to penetrate the spin plate 213 in the perpendicular direction. The pin supporter 222 is provided to extend in the horizontal direction from a lower end of the shaft portion 221. The holder 223 is provided to project downward from a tip end of the pin supporter 222. Further, the magnet 224 is attached to an upper end of the shaft portion 221 on the upper surface side of the spin plate 213.

Each chuck pin 220 is rotatable about a vertical axis passing through the center of the shaft portion 221, and can be switched between a closed state where the holder 223 is contact with the outer peripheral end WE (FIG. 7) of the substrate W and an opened state where the holder 223 is spaced apart from the outer peripheral end WE of the substrate W. In the present example, each chuck pin 220 is in the closed state in the case where an N pole of the magnet 224 is on the inner side, and each chuck pin 220 is in the opened state in the case where an S pole of the magnet 224 is on the inner side. Further, in the closed state, the holder 223 is in contact with the bevel portions 1, 2 (FIG. 7) of the substrate W.

As described in FIG. 9, the four arc-like magnet plates 231A, 231B, 232A, 232B are arranged in a circumferential direction extending about the rotation shaft 212 above the spin plate 213. The magnet plate 232A of the four magnet plates 231A, 231B, 232A, 232B is located above a path on which the polishing head ph is moved by rotation of the arm 410 of the substrate polishing mechanism 400 of FIG. 1. Further, the magnet plate 232B is located above a path on which the cleaning brush cb is moved by rotation of the arm 510 of the substrate cleaning mechanism 500 of FIG. 1.

Each of the magnet plates 231A, 231B, 232A, 232B has an S pole on the outside and has an N pole on the inside. The magnet lifting lowering mechanisms 233A, 2336, 234A, 2346 respectively lift and lower the magnet plates 231A, 231B, 232A, 232B. Thus, each of the magnet plates 231A, 2316, 232A, 232B can be independently moved between an upper position higher than the magnet 224 of the chuck pin 220 and a lower position at a height substantially equal to the height of the magnet 224 of the chuck pin 220.

Each chuck pin 220 is switched between the opened state and the closed state by the lifting and lowering of the magnet plates 231A, 232B, 232A, 232B. Specifically, each chuck pin 220 enters the opened state in the case where a magnet plate, closest to the chuck pin 220, of the plurality of magnet plates 231A, 2316, 232A, 232B is located at the upper position. On the other hand, each chuck pin 220 enters the closed state in the case where a magnet plate, closest to the chuck pin 220, of the plurality of magnet plates 231A, 231B, 232A, 232B is located at the lower position.

As shown in FIGS. 8 and 9, the plurality of auxiliary pins 290 are provided at the peripheral portion of the spin plate 213 at equal angular intervals with respect to the rotation shaft 212, and provided not to interfere with the plurality of chuck pins 220. In the present example, the eight auxiliary pins 290 are provided at the peripheral portion of the spin plate 213 at angular intervals of 45 degrees with respect to the rotation shaft 212. Each auxiliary pin 290 is arranged to penetrate the spin plate 213 in the perpendicular direction at a middle position between two adjacent chuck pins 220. With each chuck pin 220 in the closed state and the holder 223 in contact with the bevel portions 1, 2 (FIG. 7) of the substrate W, part of each auxiliary pin 290 is in contact with the bevel portion 1 of the substrate W. At this time, the lower end of the auxiliary pin 290 is formed not to project downward from the substrate W.

During the polishing of the lower surface of the substrate W, the auxiliary pin 290 generates a reaction force in the substrate W against a pushing force applied to the lower surface of the substrate W by the polishing head ph of the substrate polishing mechanism 400. Further, during the cleaning of the lower surface of the substrate W, the auxiliary pin 290 generates a reaction force in the substrate W against the pushing force applied to the lower surface of the substrate W by the cleaning brush cb of the substrate cleaning mechanism 500.

As described above, the guard mechanism 300 includes the guard 310 and the guard lifting lowering driver 320. In FIG. 8, the guard 310 is shown in the longitudinal cross sectional view. The guard 310 is rotationally symmetric with respect to the rotation shaft 212 of the spin chuck 200, and provided at a position further outward than the spin chuck 200 and a space below the spin chuck 200. The guard lifting lowering driver 320 lifts and lowers the guard 310. The guard 310 receives the cleaning liquid splashed from the substrate W during the polishing and the cleaning of the substrate W and leads the cleaning liquid to the liquid receiving vat 720 of FIG. 1.

The plurality of receiving transferring mechanisms 350 are arranged around the rotation shaft 212 of the spin chuck 200 at equal angular intervals and at positions outward of than the guard 310. Each receiving transferring mechanism 350 includes a lifting lowering rotation driver 351, a rotation shaft 352, an arm 353 and a holding pin 354.

The rotation shaft 352 is provided to extend upward from the lifting lowering rotation driver 351. The arm 353 is provided to extend in the horizontal direction from an upper end of the rotation shaft 352. The holding pin 354 is provided at a tip end of the arm 353 to be capable of holding the outer peripheral end WE of the substrate W. The rotation shaft 352 performs a lifting lowering operation and a rotating operation by the lifting lowering rotation driver 351. Thus, the holding pin 354 is moved in the horizontal direction and the up-and-down direction.

(5) Control System of Substrate Cleaning Device

Figure 10:
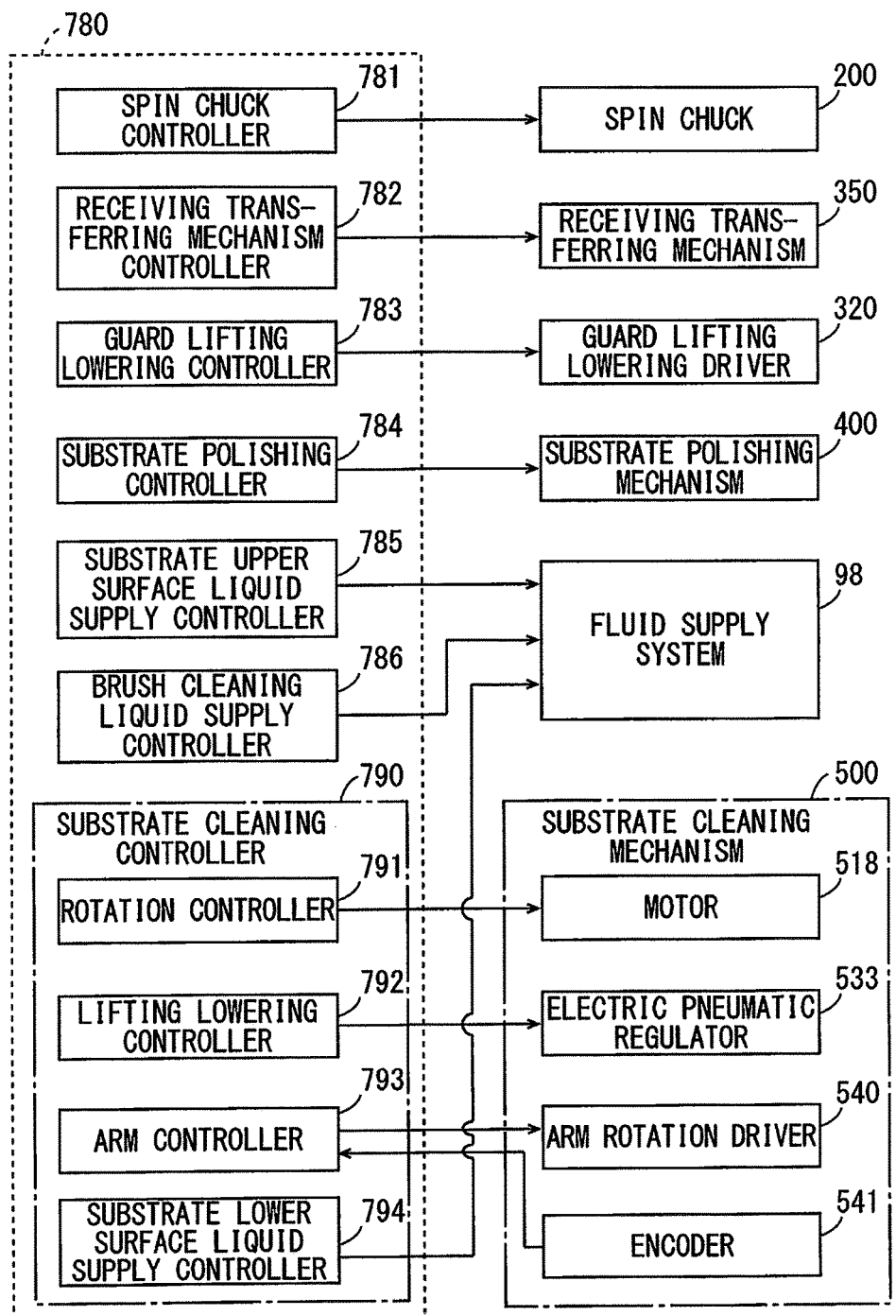
FIG. 10 is a block diagram showing a configuration of a control system of the substrate cleaning device of FIG. 1.

FIG. 10 is a block diagram showing the configuration of the control system of the substrate cleaning device 700 of FIG. 1. In FIG. 10, the functional configuration of the polishing cleaning controller 780 is shown. The polishing cleaning controller 780 includes a spin chuck controller 781, a receiving transferring mechanism controller 782, a guard lifting lowering controller 783, a substrate polishing controller 784, a substrate upper surface liquid supply controller 785, a brush cleaning liquid supply controller 786 and a substrate cleaning controller 790. The substrate cleaning controller 790 further includes a rotation controller 791, a lifting lowering controller 792, an arm controller 793 and a substrate lower surface liquid supply controller 794. The function of each part of the polishing cleaning controller 780 of FIG. 10 is realized by the execution of the control program by the CPU.

The rotation controller 791, the lifting lowering controller 792, the arm controller 793 and the substrate lower surface liquid supply controller 794 of the substrate cleaning controller 790 mainly control an operation of each part of the substrate cleaning mechanism 500. More specifically, the rotation controller 791 adjusts a rotation speed of the cleaning brush cb of the substrate cleaning mechanism 500 by controlling the motor 518 (FIG. 4). The lifting lowering controller 792 adjusts the height of the cleaning brush cb of the substrate cleaning mechanism 500 by controlling the electric pneumatic regulator 533 (FIG. 4). The arm controller 793 performs feedback control of the rotation angle of the arm 510 by controlling the arm rotation driver 540 based on a signal from the encoder 541 (FIG. 4) of the substrate cleaning mechanism 500. The substrate lower surface liquid supply controller 794 adjusts a supply amount of the cleaning liquid from the nozzle 510N of the substrate cleaning mechanism 500 to the substrate W by controlling the fluid supply system 98.

The spin chuck controller 781 controls an operation of each part of the spin chuck 200. The receiving transferring mechanism controller 782 controls the operations of the plurality of receiving transferring mechanisms 350 provided in the substrate cleaning device 700. The guard lifting lowering controller 783 adjusts the height of the guard 310 by controlling the guard lifting lowering driver 320 of the guard mechanism 300. The substrate polishing controller 784 controls an operation of each part of the substrate polishing mechanism 400. The substrate polishing mechanism 400 basically has the same configuration as that of the substrate cleaning mechanism 500 as described above. Therefore, the substrate polishing controller 784 also basically has the same configuration as that of the above-mentioned substrate cleaning controller 790.

The substrate upper surface liquid supply controller 785 adjusts a supply amount of the cleaning liquid from the liquid supply pipe 215 (FIG. 8) of the spin chuck 200 to the substrate W by controlling the fluid supply system 98. The brush cleaning liquid supply controller 786 adjusts the supply amount of the cleaning liquid from the cleaning liquid introduction pipe 630 of the brush cleaning mechanism 600 to the inner space 625 of the space forming member 620 by controlling the fluid supply system 98.

(6) Polishing and Cleaning of Lower Surface of Substrate by Substrate Cleaning Device In the substrate cleaning device 700 of FIG. 1, the substrate W is carried into the casing 710, for example, and then cleaning of the upper surface of the substrate W, the polishing of the lower surface of the substrate W and the cleaning of the lower surface of the substrate W are continuously performed in this order. The operation of the substrate cleaning device 700 will be described.

Figure 11A:
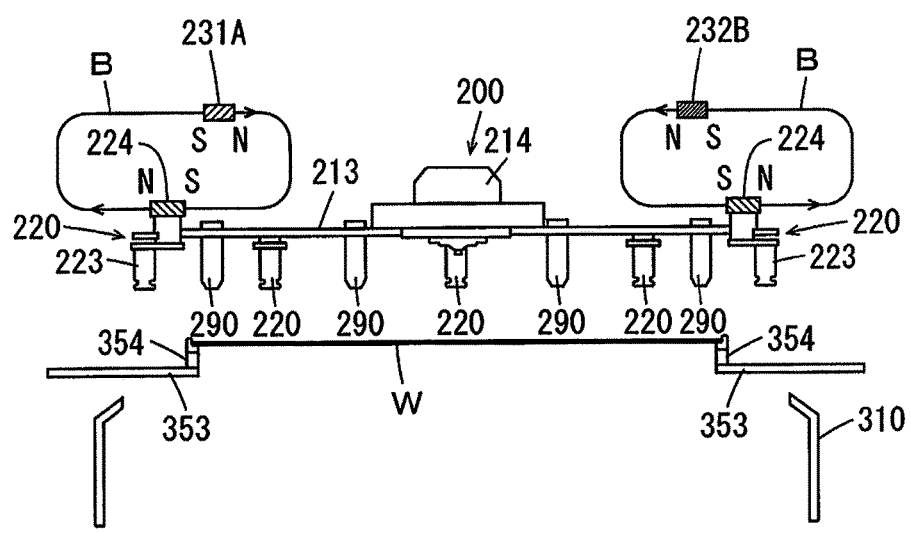
FIGS. 11A and 11B are side views showing an operation of the substrate cleaning device when the substrate is carried into a casing.

FIGS. 11A to 12B are side views showing the operation of the substrate cleaning device 700 when the substrate W is carried into the casing 710. First, as shown in FIG. 11A, the guard 310 is moved to a position lower than the chuck pins 220. Then, the holding pins 354 of the plurality of receiving transferring mechanisms 350 (FIG. 8) are moved to positions below the spin plate 213 through a position above the guard 310. The substrate W is placed on the plurality of holding pins 354 by the transport mechanism (not shown).

At this time, all of the magnet plates 231A, 231B, 232A, 232B (FIG. 9) are located at the upper positions. In this case, lines of magnetic force B of the magnetic plates 231A, 231B, 232A, 232B are directed outward at the height of the magnet 224 of the chuck pin 220. Thus, the S pole of the magnet 224 of each chuck pin 220 is attracted inward. Thus, each chuck pin 220 enters the opened state.

Figure 11B:
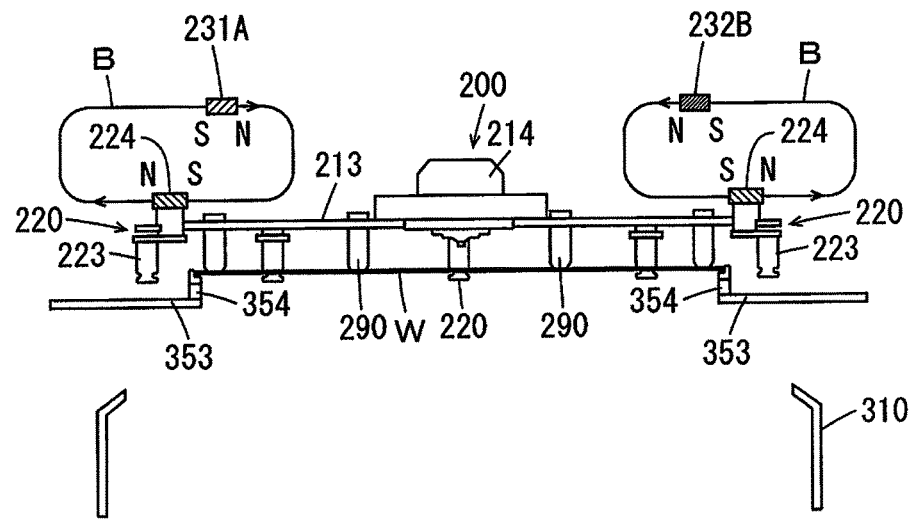

Next, as shown in FIG. 11B, the plurality of holding pins 354 are lifted while holding the substrate W. Thus, the substrate W is moved to a position among the holders 223 of the plurality of chuck pins 220. Further, the bevel portion 1 (FIG. 7) of the substrate W comes into contact with the plurality of auxiliary pins 290.

Figure 12A:
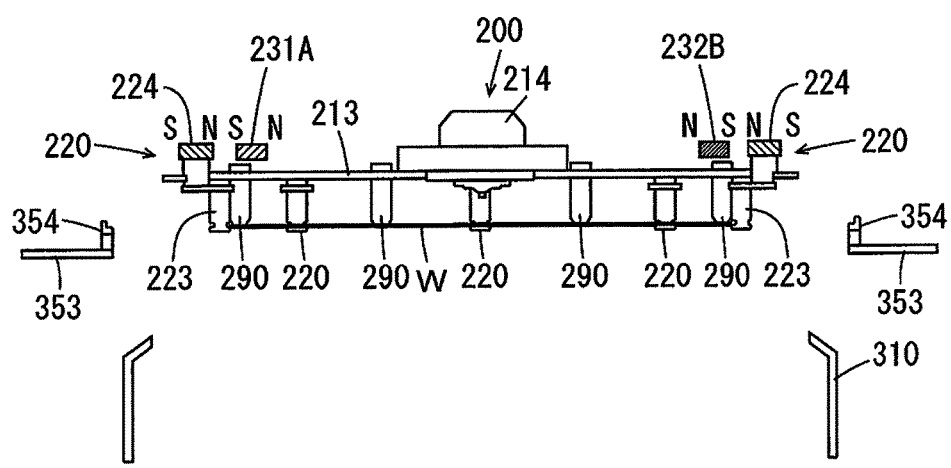
FIGS. 12A and 12B are side views showing the operation of the substrate cleaning device when the substrate is carried into the casing.

Subsequently, as shown in FIG. 12A, all of the magnet plates 231A, 231B, 232A, 232B (FIG. 9) are moved to the lower positions. In this case, the N pole of the magnet 224 of each chuck pin 220 is attracted inward, and each chuck pin 220 enters the closed state. Thus, with the bevel portion 1 (FIG. 7) of the substrate W in contact with the plurality of auxiliary pins 290, the bevel portions 1, 2 (FIG. 7) of the substrate W are held by the holder 223 of each chuck pin 220. Thereafter, the plurality of holding pins 354 are moved to positions outward of the spin chuck 200.

Figure 12B:
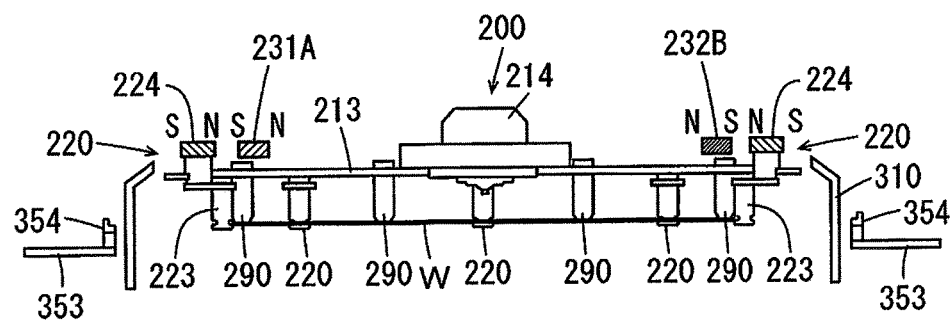

Next, as shown in FIG. 12B, the guard 310 is moved to the height at which the substrate W held by the chuck pins 220 is surrounded by the guard 310. In this state, the cleaning of the upper surface of the substrate W is started.

FIG. 13 is a side view for explaining the cleaning of the upper surface of the substrate W. As shown in FIG. 13, when the upper surface of the substrate W is cleaned, the cleaning liquid is supplied to the upper surface of the substrate W through the liquid supply pipe 215 with the substrate W rotated by the spin chuck 200. The cleaning liquid spreads to the entire upper surface of the substrate W by a centrifugal force and is splashed outward. Thus, particles or the like adhering to the upper surface of the substrate W are cleaned away.

FIG. 14 is a side view for explaining the polishing of the lower surface of the substrate W. When the lower surface of the substrate W is polished, the cleaning liquid is discharged from the nozzle 410N of the substrate polishing mechanism 400 with the substrate W rotated by the spin chuck 200. Further, the polishing head ph of the substrate polishing mechanism 400 is moved from the head waiting position p1 of FIG. 1 to a position opposite to the center portion of the lower surface of the substrate W, and the polishing head ph is lifted until the upper end surface comes into contact with the lower surface of the substrate W. The upper end surface of the polishing head ph comes into contact with the substrate W, and the polishing head ph pushes the lower surface of the substrate W at a predetermined pressure. In this state, as indicated by a thick arrow in FIG. 14, the polishing head ph is moved from the center portion of the lower surface to the peripheral portion of the lower surface of the substrate W. At this time, the polishing head ph may be rotated about the central axis, or does not have to be rotated. In this manner, the lower surface of the substrate W is polished by the polishing head ph. The lower surface of the substrate W is polished, and then the polishing head ph is moved to a predetermined height lower than the substrate W and moved to the head waiting position p1 of FIG. 1.

When the peripheral portion of the lower surface of the substrate W is polished by the polishing head ph, the polishing head ph may interfere with the plurality of chuck pins 220. Then, in the present example, when the polishing head ph reaches the peripheral portion of the lower surface of the substrate W, the magnet plate 232A of FIG. 9 is moved from the lower position to the upper position by the magnet lifting lowering mechanism 234A of FIG. 9. Thus, each chuck pin 220 locally enters the opened state in a region corresponding to the magnet plate 232A of the plurality of magnet plates 231A, 231B, 232A, 232B. In this case, because the magnet plate 232A is located above the moving path of the polishing head ph, the polishing head ph is prevented from interfering with the plurality of chuck pins 220.

After the polishing of the peripheral portion of the lower surface of the substrate W by the polishing head ph, the magnet plate 232A of FIG. 9 is moved from the upper position to the lower position. Thus, the substrate W is held by all of the chuck pins 220.

Figure 15:
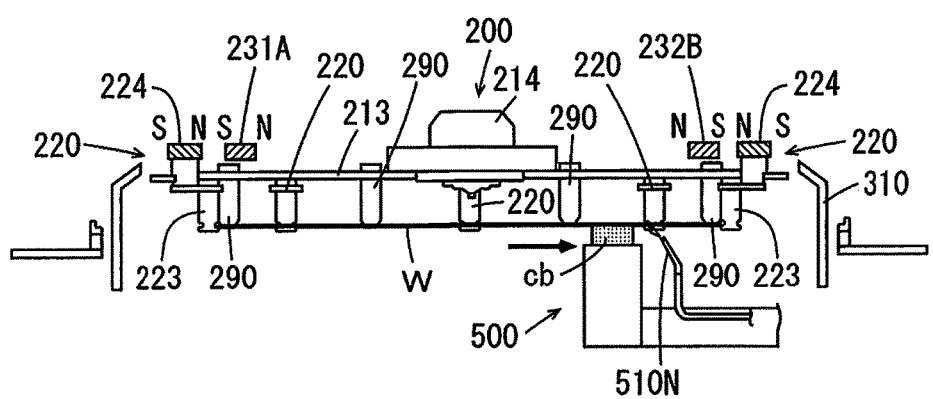
FIG. 15 is a side view for explaining cleaning of the lower surface of the substrate.

FIG. 15 is a side view for explaining the cleaning of the lower surface of the substrate W. When the lower surface of the substrate W is cleaned, the cleaning liquid is discharged from the nozzle 510N of the substrate cleaning mechanism 500 with the substrate W rotated by the spin chuck 200. Further, the cleaning brush cb of the substrate cleaning mechanism 500 is moved from the brush waiting position p2 of FIG. 1 to a position opposite to the center portion of the lower surface of the substrate W, and the cleaning brush cb is lifted until the upper end surface comes into contact with the lower surface of the substrate W. The upper end surface of the cleaning brush cb comes into contact with the substrate W, and the cleaning brush cb pushes the lower surface of the substrate W at a predetermined pressure. In this state, as indicated by a thick arrow in FIG. 15, the cleaning brush cb is moved from the center portion of the lower surface of the substrate W to the peripheral portion of the lower surface of the substrate W. At this time, the cleaning brush cb may be rotated about its central axis, or does not have to be rotated. In this manner, the lower surface of the substrate W is cleaned by the cleaning brush cb. Thus, contaminants stripped off the substrate W during the polishing of the lower surface of the substrate W are physically removed and cleaned away. After the cleaning of the lower surface of the substrate W, the cleaning brush cb is moved to a predetermined height lower than the substrate W and is moved to the brush waiting position p2 of FIG. 1.

When the peripheral portion of the lower surface of the substrate W is cleaned by the cleaning brush cb, the cleaning brush cb may interfere with the plurality of chuck pins 220. Then, in the present example, when the cleaning brush cb reaches the peripheral portion of the lower surface of the substrate W, the magnet plate 232B of FIG. 9 is moved from the lower position to the upper position by the magnet lifting lowering mechanism 234B of FIG. 9. Thus, each chuck pin 220 locally enters the opened state in a region corresponding to the magnet plate 232B of the plurality of magnet plates 231A, 231B, 232A, 232B. In this case, because the magnet plate 232B is located above the moving path of the cleaning brush cb, the cleaning brush cb is prevented from interfering with the plurality of chuck pins 220.

After the cleaning of the peripheral portion of the lower surface of the substrate W by the cleaning brush cb, the magnet plate 232B of FIG. 9 is moved from the upper position to the lower position. Thus, the substrate W is held by all of the chuck pins 220.

As described above, when the peripheral portion of the lower surface of the substrate W is polished and cleaned, one of the chuck pins 220 is spaced apart from the outer peripheral end WE of the substrate W. At this time, the outer peripheral end WE of the substrate W in the vicinity of the one chuck pin 220 is not held by the one chuck pin 220. Even in this state, the two auxiliary pins 290 adjacent to the one chuck pin 220 abut against the bevel portion 1 of the substrate W, and generate a reaction force against a pushing force supplied from the polishing head ph or the cleaning brush cb to the substrate W. Therefore, deflection of the substrate W is prevented.

The cleaning processing for the upper surface of the substrate W, the polishing processing for the lower surface of the substrate W and the cleaning processing for the lower surface of the substrate W are performed, and then the drying processing for the substrate W is performed. In this case, with the substrate W held by all of the chuck pins 220, the substrate W is rotated at a high speed. Thus, the cleaning liquid adhering to the substrate W is shaken off, and the substrate W is dried.

During the drying processing for the substrate W, gas such as an inert gas (a nitrogen gas, for example) or air may be supplied to the substrate W through the liquid supply pipe 215. In this case, the cleaning liquid on the substrate W is blown off outward by an air stream formed between the spin plate 213 and the substrate W. Thus, the substrate W can be efficiently dried.

When the drying processing for the substrate W ends, the substrate W is carried out from the casing 710 in the reverse steps of the above-mentioned steps for carrying in the substrate W.

(7) Substrate Processing Apparatus

Figure 16:
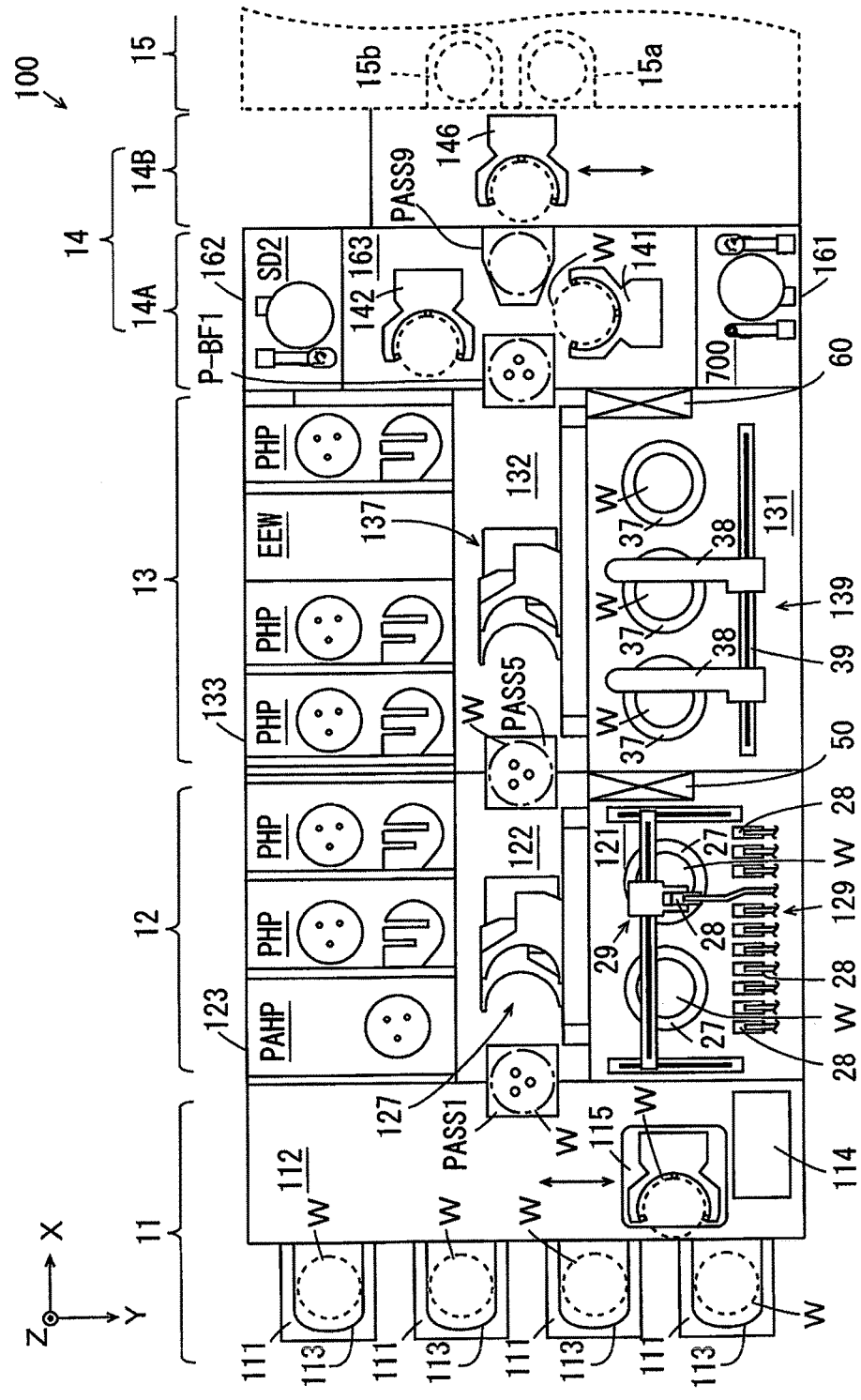
FIG. 16 is a schematic plan view of a substrate processing apparatus including the substrate cleaning device of FIG. 1.
Figure 17:
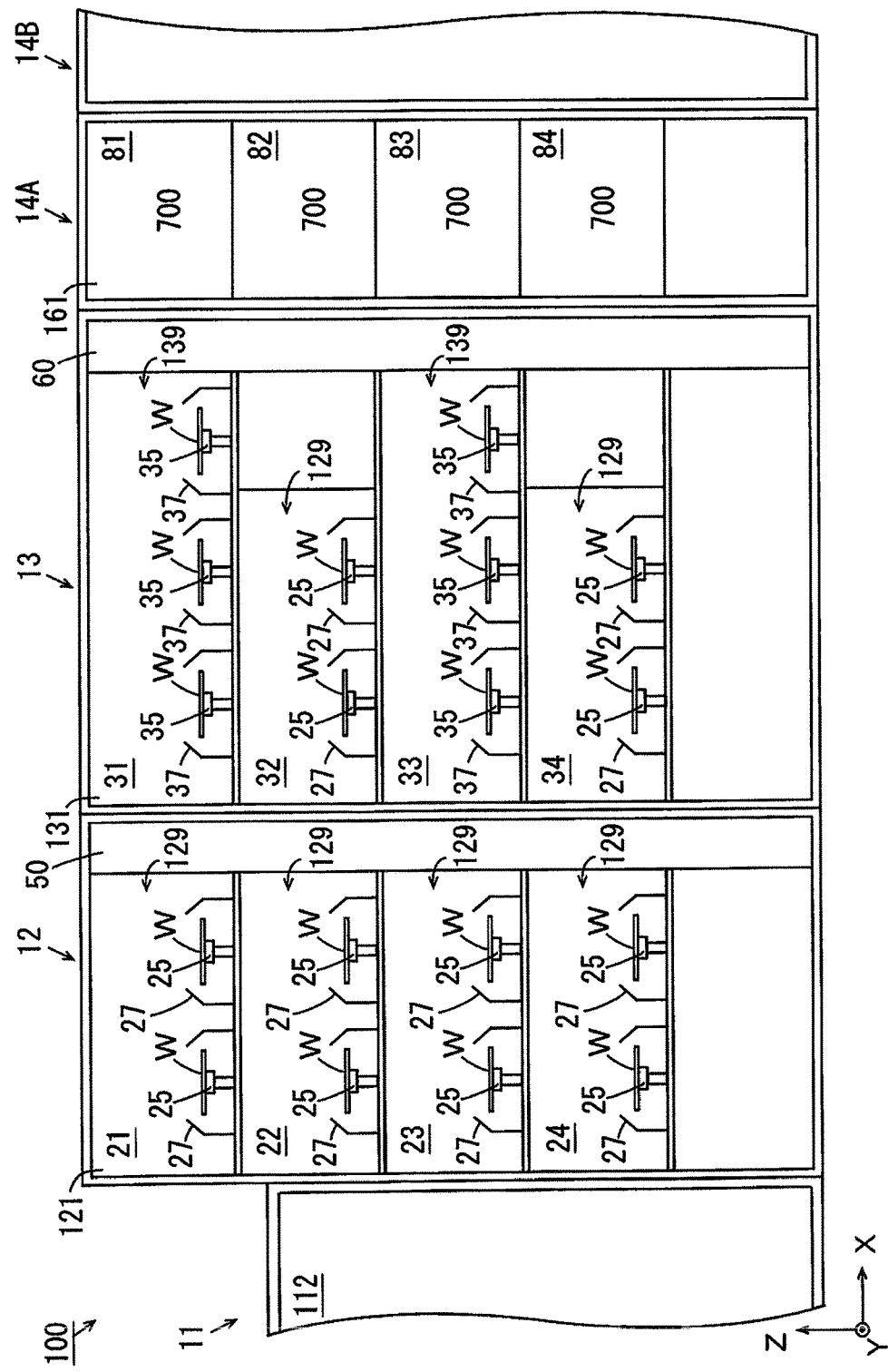
FIG. 17 is a schematic side view of the substrate processing apparatus mainly showing a coating processing section, a coating development processing section and a cleaning drying processing section of FIG. 16.
Figure 18:
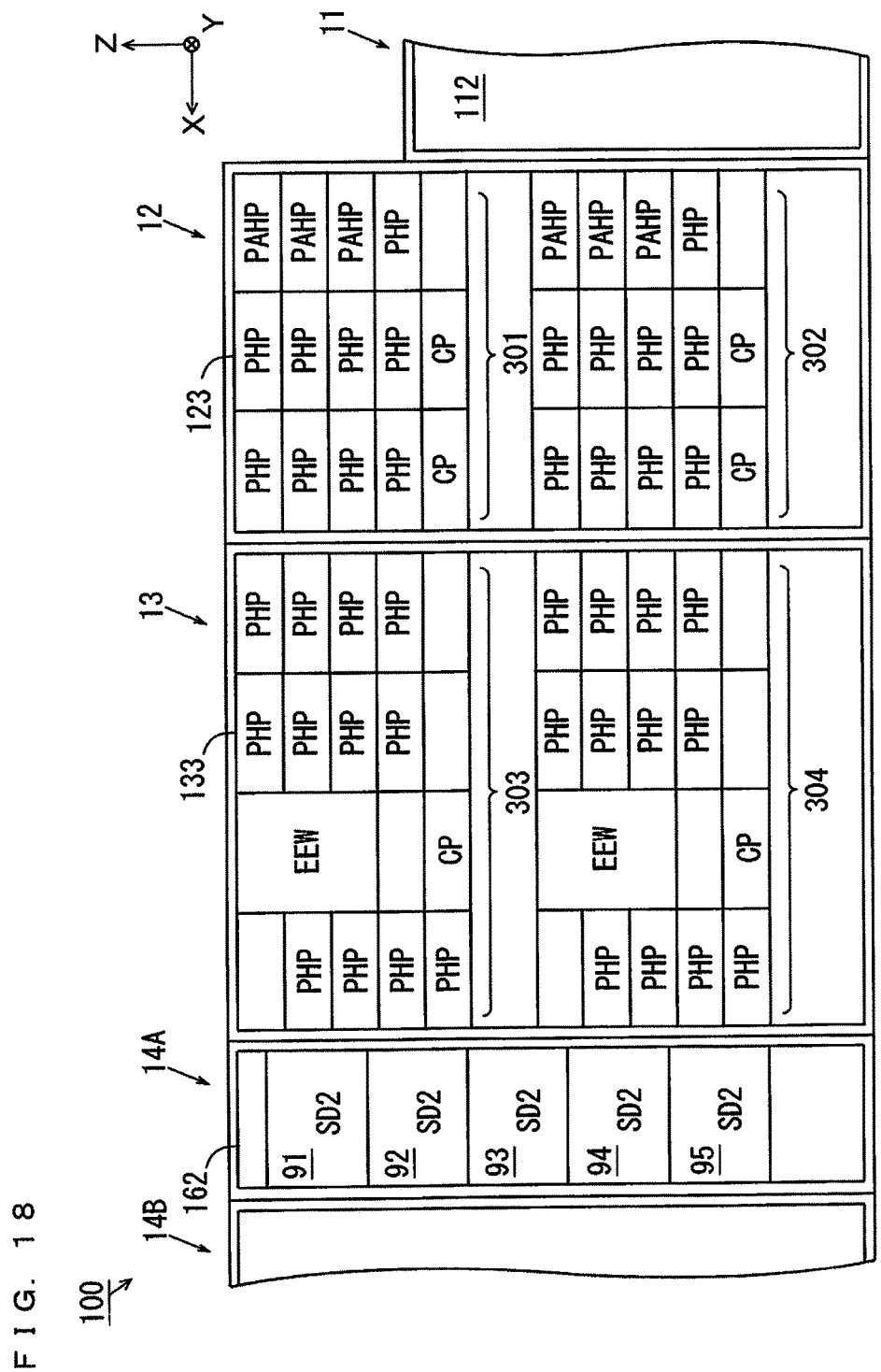
FIG. 18 is a schematic side view of the substrate processing apparatus mainly showing thermal processing sections and a cleaning drying processing section of FIG. 16.
Figure 19:
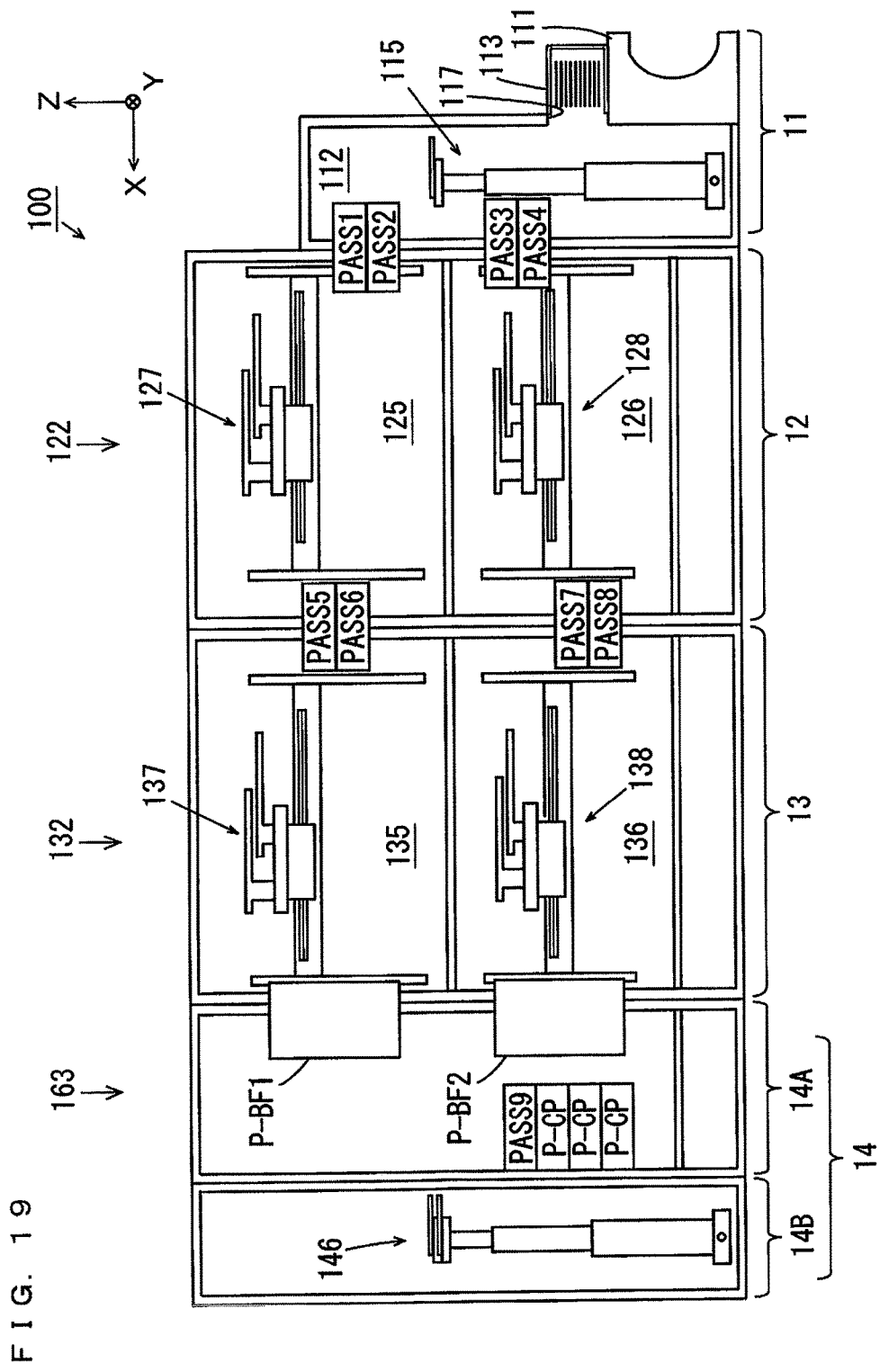
FIG. 19 is a side view mainly showing transport sections of FIG. 16.

FIG. 16 is a schematic plan view of the substrate processing apparatus including the substrate cleaning device 700 of FIG. 1. FIG. 16 and the subsequent given drawings FIGS. 17 to 19 are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 16, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

The indexer block 11 includes a plurality of carrier platforms 111 and a transport section 112. In each carrier platform 111, a carrier 113 for storing the plurality of substrates W in multiple stages is placed.

In the transport section 112, a main controller 114 and a transport device 115 are provided. The main controller 114 controls various constituent elements of the substrate processing apparatus 100. The transport device 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. A substrate platform PASS1 and below-mentioned substrate platforms PASS2 to PASS4 (see FIG. 19) on which the substrates W are placed are provided between the transport section 122 and the indexer block 11. A transport device 127 and a below-mentioned transport device 128 (see FIG. 19), which transport the substrates W, are provided in the transport section 122.

The second processing block 13 includes a coating development processing section 131, a transport section 132 and a thermal processing section 133. The coating development processing section 131 and the thermal processing section 133 are opposite to each other with the transport section 132 interposed therebetween. A substrate platform PASS5 and below-mentioned substrate platforms PASS6 to PASS8 (see FIG. 19) on which the substrates W are placed, are provided between the transport section 132 and the transport section 122. A transport device 137 and a below-mentioned transport device 138 (see FIG. 19), which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport devices 141, 142 are provided in the transport section 163.

A placement buffer unit P-BF1 and a below-mentioned placement buffer unit P-BF2 (see FIG. 19) are provided between the transport section 163 and the transport section 132.

Further, a substrate platform PASS9 and below-mentioned placement cooling units P-CP (see FIG. 19) are provided to be adjacent to the carry-in carry-out block 14B between the transport devices 141, 142.

A transport device 146 is provided in the carry-in carry-out block 14B. The transport device 146 carries in the substrate W to and carries out the substrate W from the exposure device 15. A substrate inlet 15a for carrying in the substrate W and a substrate outlet 15b for carrying out the substrate W are provided in the exposure device 15.

(8) Configurations of Coating Processing Section and Coating Development Processing Section FIG. 17 is a schematic side view of the substrate processing apparatus 100 mainly showing the coating processing section 121, the coating development processing section 131 and the cleaning drying processing section 161 of FIG. 16.

As shown in FIG. 17, the coating processing section 121 has coating processing chambers 21, 22, 23, 24 provided in a stack. Each of the coating processing chambers 21 to 24 is provided with a coating processing unit (a spin coater) 129. The coating development processing section 131 has development processing chambers 31, 33 and coating processing chambers 32, 34 provided in a stack. Each of the development processing chambers 31, 33 is provided with a development processing unit (a spin developer) 139, and each of the coating processing chambers 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two pairs of the spin chuck 25 and the cup 27. The spin chuck 25 is driven to be rotated by a driving device (an electric motor, for example) that is not shown. Further, as shown in FIG. 16, each coating processing unit 129 includes a plurality of processing liquid nozzles 28 for discharging a processing liquid and a nozzle transport mechanism 29 for transporting the processing liquid nozzles 28.

In the coating processing unit 129, each of the spin chucks 25 is rotated by a driving device (not shown); and any processing liquid nozzle 28 of the plurality of processing liquid nozzles 28 is moved to a position above the substrate W by the nozzle transport mechanism 29, and the processing liquid is discharged from the processing liquid nozzle 28. Thus, the processing liquid is applied onto the substrate W.

Further, a rinse liquid is discharged to the peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Similarly to the coating processing unit 129, the development processing unit 139 includes spin chucks 35 and cups 37. Further, as shown in FIG. 16, the development processing unit 139 includes two development nozzles 38 that discharge a development liquid and a moving mechanism 39 that moves the development nozzles 38 in the X direction.

In the development processing unit 139, the spin chuck 35 is rotated by a driving device (not shown), and one development nozzle 38 supplies the development liquid to each substrate W while being moved in the X direction. Thereafter, the other development nozzle 38 supplies the development liquid to each substrate W while being moved. In this case, the development processing for the substrate W is performed by the supply of the development liquid to the substrate W. Further, in the present embodiment, development liquids different from each other are discharged from the two development nozzles 38. Thus, two types of development liquids can be supplied to each substrate W.

In the cleaning drying processing section 161, cleaning drying processing chambers 81, 82, 83, 84 are provided in a stack. In each of the cleaning drying processing chambers 81 to 84, the substrate cleaning device 700 of FIG. 1 is provided. In the substrate cleaning device 700, the upper surface cleaning processing, the lower surface polishing processing, the lower surface cleaning processing and the drying processing for the substrate W on which the exposure processing has not been performed are performed, and the cleaning processing for the cleaning brush cb is performed.

The polishing cleaning controllers 780 of the plurality of substrate cleaning devices 700 provided in the cleaning drying processing section 161 may be provided in an upper portion of the cleaning drying processing section 161 as local controllers. Alternatively, the main controller 114 of FIG. 16 may perform each type of processing performed by the polishing cleaning controllers 780 of the plurality of substrate cleaning devices 700.

As shown in FIGS. 16 and 17, a fluid box 50 is provided in the coating processing section 121 to be adjacent to the coating development processing section 131. Similarly, a fluid box 60 is provided in the coating development processing section 131 to be adjacent to the cleaning drying processing block 14A. The fluid box 50 and the fluid box 60 each house fluid related elements such as a pipe, a joint, a valve, a flowmeter, a regulator, a pump, a temperature adjuster used to supply a processing liquid and a development liquid to the coating processing units 129 and the development processing units 139 and discharge the liquid and air and the like out of the coating processing units 129 and the development processing units 139.

(9) Configuration of Thermal Processing Sections

FIG. 18 is a schematic side view of the substrate processing apparatus 100 mainly showing the thermal processing sections 123, 133 and the cleaning drying processing section 162 of FIG. 16. As shown in FIG. 18, the thermal processing section 123 has an upper thermal processing section 301 provided above and a lower thermal processing section 302 provided below. A plurality of thermal processing devices PHP, a plurality of adhesion reinforcement processing units PAHP and a plurality of cooling units CP are provided in each of the upper thermal processing section 301 and the lower thermal processing section 302.

Heating processing for the substrate W is performed in each thermal processing device PHP. In each adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. A cooling unit CP, a plurality of thermal processing devices PHP and an edge exposure unit EEW are provided in each of the upper thermal processing section 303 and the lower thermal processing section 304.

In the edge exposure unit EEW, exposure processing (edge exposure processing) is performed on a region having a constant width at the peripheral portion of the resist film formed on the substrate W. In each of the upper thermal processing section 303 and the lower thermal processing section 304, each thermal processing device PHP provided to be adjacent to the cleaning drying processing block 14A is configured to be capable of receiving the substrate W carried in from the cleaning drying processing block 14A.

In the cleaning drying processing section 162, cleaning drying processing chambers 91, 92, 93, 94, 95 are provided in a stack. In each of the cleaning drying processing chambers 91 to 95, a cleaning drying processing unit SD2 is provided. Each cleaning drying processing unit SD2 has the same configuration as the substrate cleaning device 700 except that the substrate polishing mechanism 400 is not provided and the magnet plates 231A, 231B, 232A of FIG. 9 are integrally provided. In the cleaning drying processing unit SD2, the upper surface cleaning processing, the lower surface cleaning processing and the drying processing for the substrate W on which the exposure processing has been performed are performed, and the cleaning processing for the cleaning brush cb is performed.

(10) Configuration of Transport Sections

FIG. 19 is a side view mainly showing the transport sections 122, 132, 163 of FIG. 16. As shown in FIG. 19, the transport section 122 has an upper transport chamber 125 and a lower transport chamber 126. The transport section 132 has an upper transport chamber 135 and a lower transport chamber 136. The upper transport chamber 125 is provided with the transport device (transport robot) 127, and the lower transport chamber 126 is provided with the transport device 128. Further, the upper transport chamber 135 is provided with the transport device 137, and the lower transport chamber 136 is provided with the transport device 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The transport device 127 is configured to be capable of transporting the substrates W among the substrate platforms PASS1, PASS2, PASS5, PASS6, the coating processing chambers 21, 22 (FIG. 17) and the upper thermal processing section 301 (FIG. 18). The transport device 128 is configured to be capable of transporting the substrates W among the substrate platforms PASS3, PASS4, PASS7, PASS8, the coating processing chambers 23, 24 (FIG. 17) and the lower thermal processing section 302 (FIG. 18).

The transport device 137 is configured to be capable of transporting the substrates W among the substrate platforms PASS5, PASS6, the placement buffer unit P-BF1, the development processing chamber 31 (FIG. 17), the coating processing chamber 32 (FIG. 17) and the upper thermal processing section 303 (FIG. 18). The transport device 138 is configured to be capable of transporting the substrates W among the substrate platforms PASS7, PASS8, the placement buffer unit P-BF2, the development processing chamber 33 (FIG. 17), the coating processing chamber 34 (FIG. 17) and the lower thermal processing section 304 (FIG. 18).

The transport device 141 (FIG. 16) of the transport section 163 is configured to be capable of transporting the substrate W among the placement cooling unit P-CP, the substrate platform PASS9, the placement buffer units P-BF1, P-BF2 and the cleaning drying processing section 161 (FIG. 17).

The transport device 142 (FIG. 16) of the transport section 163 is configured to be capable of transporting the substrate W among the placement cooling unit P-CP, the substrate platform PASS9, the placement buffer units P-BF1, P-BF2, the cleaning drying processing section 162 (FIG. 18), the upper thermal processing section 303 (FIG. 18) and the lower thermal processing section 304 (FIG. 18).

(11) Operation of Substrate Processing Apparatus

The operation of the substrate processing apparatus 100 will be described with reference to FIGS. 16 to 19. The carriers 113 in which the unprocessed substrates W are stored are placed on the carrier platforms 111 (FIG. 16) in the indexer block 11. The transport device 115 transports the unprocessed substrate W from the carrier 113 to each of the substrate platforms PASS1, PASS3 (FIG. 19). Further, the transport device 115 transports the processed substrate W that is placed on each of the substrate platforms PASS2, PASS4 (FIG. 19) to the carrier 113.

In the first processing block 12, the transport device 127 (FIG. 19) sequentially transports the substrate W placed on the substrate platform PASS1 to the adhesion reinforcement processing unit PAHP (FIG. 18), the cooling unit CP (FIG. 18) and the coating processing chamber 22 (FIG. 17). Next, the transport device 127 sequentially transports the substrate W on which the anti-reflection film is formed by the coating processing chamber 22 to the thermal processing device PHP (FIG. 18), the cooling unit CP (FIG. 18) and the coating processing chamber 21 (FIG. 17). Then, the transport device 127 sequentially transports the substrate W on which the resist film is formed by the coating processing chamber 21 to the thermal processing device PHP (FIG. 18) and the substrate platform PASS5 (FIG. 19).

In this case, the adhesion reinforcement processing is performed on the substrate W in the adhesion reinforcement processing unit PAHP, and then the substrate W is cooled to a temperature suitable for formation of the anti-reflection film in the cooling unit CP. Next, the anti-reflection film is formed on the substrate W by the coating processing unit 129 (FIG. 17) in the coating processing chamber 22. Subsequently, the thermal processing for the substrate W is performed in the thermal processing device PHP, and then the substrate W is cooled in the cooling unit CP to a temperature suitable for the formation of the resist film. Next, in the coating processing chamber 21, the resist film is formed on the substrate W by the coating processing unit 129 (FIG. 17). Thereafter, the thermal processing for the substrate W is performed in the thermal processing device PHP, and the substrate W is placed on the substrate platform PASS5.

Further, the transport device 127 transports the substrate W on which the development processing has been performed and which is placed on the substrate platform PASS6 (FIG. 19) to the substrate platform PASS2 (FIG. 19).

The transport device 128 (FIG. 19) sequentially transports the substrate W placed on the substrate platform PASS3 to the adhesion reinforcement processing unit PAHP (FIG. 18), the cooling unit CP (FIG. 18) and the coating processing chamber 24 (FIG. 17). Then, the transport device 128 sequentially transports the substrate W on which the anti-reflection film is formed by the coating processing chamber 24 to the thermal processing device PHP (FIG. 18), the cooling unit CP (FIG. 18) and the coating processing chamber 23 (FIG. 17). Subsequently, the transport device 128 sequentially transports the substrate W on which the resist film is formed by the coating processing chamber 23 to the thermal processing device PHP (FIG. 18) and the substrate platform PASS7 (FIG. 19).

Further, the transport device 128 (FIG. 19) transports the substrate W on which the development processing has been performed and which is placed on the substrate platform PASS8 (FIG. 19) to the substrate platform PASS4 (FIG. 19). The processing contents for the substrate W in each of the coating processing chambers 23, 24 (FIG. 17) and the lower thermal processing section 302 (FIG. 18) are similar to the processing contents for the substrate W in each of the coating processing chambers 21, 22 (FIG. 17) and the upper thermal processing section 301 (FIG. 18) that are described above.

In the second processing block 13, the transport device 137 (FIG. 19) sequentially transports the substrate W on which the resist film is formed and which is placed on the substrate platform PASS5 to the coating processing chamber 32 (FIG. 17), the thermal processing device PHP (FIG. 18), the edge exposure unit EEW (FIG. 18) and the placement buffer unit P-BF1 (FIG. 19). In this case, in the coating processing chamber 32, the resist cover film is formed on the substrate W by the coating processing unit 129 (FIG. 17). Thereafter, the thermal processing is performed on the substrate W in the thermal processing device PHP, and the substrate W is carried into the edge exposure unit EEW. Subsequently, in the edge exposure unit EEW, the edge exposure processing is performed on the substrate W. The substrate W on which the edge exposure processing has been performed is placed on the placement buffer unit P-BF1.

Further, the transport device 137 (FIG. 19) takes out the substrate W, on which the exposure processing has been performed by the exposure device 15 and on which the thermal processing has been performed, from the thermal processing device PHP (FIG. 18) that is adjacent to the cleaning drying processing block 14A. The transport device 137 sequentially transports the substrate W to the cooling unit CP (FIG. 18), the development processing chamber 31 (FIG. 17), the thermal processing device PHP (FIG. 18) and the substrate platform PASS6 (FIG. 19).

In this case, the substrate W is cooled to a temperature suitable for the development processing in the cooling unit CP. Then, the resist cover film is removed, and the development processing for the substrate W is performed, by the development processing unit 139 in the development processing chamber 31. Thereafter, the thermal processing for the substrate W is performed in the thermal processing device PHP, and the substrate W is placed on the substrate platform PASS6.

The transport device 138 (FIG. 19) sequentially transports the substrate W on which the resist film is formed and which is placed on the substrate platform PASS7 to the coating processing chamber 34 (FIG. 17), the thermal processing device PHP (FIG. 18), the edge exposure unit EEW (FIG. 18) and the placement buffer unit P-BF2 (FIG. 19).

Further, the transport device 138 (FIG. 19) takes out the substrate W on which the exposure processing has been performed by the exposure device 15 and the thermal processing have been performed from the thermal processing device PHP (FIG. 18) that is adjacent to the cleaning drying processing block 14A. The transport device 138 sequentially transports the substrate W to the cooling unit CP (FIG. 18), the development processing chamber 33 (FIG. 17), the thermal processing device PHP (FIG. 18) and the substrate platform PASS8 (FIG. 19). The processing contents for the substrate W in the development processing chamber 33, the coating processing chamber 34 and the lower thermal processing section 304 are similar to the processing contents for the substrate W in the development processing chamber 31, the coating processing chamber 32 (FIG. 17) and the upper thermal processing section 303 (FIG. 18) that are described above.

In the cleaning drying processing block 14A, the transport device 141 (FIG. 16) transports the substrate W that is placed on each of the placement buffer units P-BF1, P-BF2 (FIG. 19) to the substrate cleaning device 700 (FIG. 17) in the cleaning drying processing section 161. Then, the transport device 141 transports the substrate W from the substrate cleaning device 700 to the placement cooling unit P-CP (FIG. 19). In this case, the cleaning and drying processing for the substrate W are performed in the substrate cleaning device 700, and then the substrate W is cooled in the placement cooling unit P-CP to a temperature suitable for the exposure processing in the exposure device 15 (FIG. 16).

The transport device 142 (FIG. 16) transports the substrate W on which the exposure processing has been performed and which is placed on the substrate platform PASS9 (FIG. 19) to the cleaning drying processing unit SD2 (FIG. 18) in the cleaning drying processing section 162. Further, the transport device 142 transports the substrate W on which the cleaning and drying processing have been performed to the thermal processing device PHP (FIG. 18) in the upper thermal processing section 303 or the thermal processing device PHP (FIG. 18) in the lower thermal processing section 304 from the cleaning drying processing unit SD2.

In this thermal processing device PHP, post-exposure bake (PEB) processing is performed.

In the carry-in carry-out block 14B, the transport device 146 (FIG. 16) transports the substrate W on which the exposure processing has not been performed and which is placed on the placement cooling unit P-CP (FIG. 19) to the substrate inlet 15a (FIG. 16) of the exposure device 15. Further, the transport device 146 (FIG. 16) takes out the substrate W on which the exposure processing has been performed from the substrate outlet 15b (FIG. 16) of the exposure device 15, and transports the substrate W to the substrate platform PASS9 (FIG. 19).

In the case where the exposure device 15 cannot receive the substrate W, the substrate W on which the exposure processing has not been performed is temporarily stored in each of the placement buffer units P-BF1, P-BF2. Further, in the case where the development processing unit 139 (FIG. 17) in the second processing block 13 cannot receive the substrate W on which the exposure processing has been performed, the substrate W on which the exposure processing has been performed is temporarily stored in each of the placement buffer units P-BF1, P-BF2.

In the above-mentioned substrate processing apparatus 100, processing for the substrate W in the coating processing chambers 21, 22, 32, the development processing chamber 31 and the upper thermal processing sections 301, 303 that are provided above, and the processing for the substrate W in the coating processing chambers 23, 24, 34, the development processing chamber 33 and the lower thermal processing sections 302, 304 that are provided below can be concurrently performed. Thus, it is possible to improve throughput without increasing a footprint.

A main surface of the substrate W here refers to a surface on which the anti-reflection film, the resist film and the resist cover film are formed, and the back surface of the substrate W refers to a surface of the substrate W on the opposite side of the main surface. Inside of the substrate processing apparatus 100 according to the present embodiment, each type of the above-mentioned processing is performed on the substrate W with the main surface of the substrate W directed upward, that is, each type of processing is performed on the upper surface of the substrate W. Therefore, in the present embodiment, the main surface of the substrate W corresponds to the upper surface of the substrate of the present invention, and the back surface of the substrate W corresponds to the lower surface of the substrate of the present invention.

(12) Effects (a) In the above-mentioned substrate cleaning device 700, the cleaning brush cb of the substrate cleaning mechanism 500 is cleaned by the brush cleaning mechanism 600. During the cleaning of the cleaning brush cb, with the circular opening 624 of the space forming member 620 closed by the upper end surface of the cleaning brush cb, the cleaning liquid is supplied to the inner space 625 of the space forming member 620. The supplied cleaning liquid flows out to the outside of the space forming member 620 through a position between the upper end surface of the cleaning brush cb and the lower end surface 623 of the space forming member 620 from the circular opening 624. Thus, contaminants remaining at the outer peripheral end of the upper end surface of the cleaning brush cb are cleaned away together with the cleaning liquid that flows out from the inner space 625 of the space forming member 620. As a result, the contaminants adhering to the lower surface of the substrate W can be removed, and the re-adherence of the removed contaminants to the substrate W is reduced.

(b) In the substrate cleaning device 700, the cleaning brush cb is moved in the casing 710 by the arm 510, the arm lifting lowering driver 530 and the arm rotation driver 540. Thus, the cleaning brush cb is appropriately positioned such that the upper end surface of the cleaning brush cb closes the circular opening 624 of the space forming member 620 during the cleaning of the cleaning brush cb. Further, the cleaning brush cb is appropriately positioned such that the upper end surface of the cleaning brush cb comes into contact with the lower surface of the substrate W during the cleaning of the lower surface of the substrate W.

In the above-mentioned configuration, it is not necessary to independently provide the configuration for performing the positioning operation of the cleaning brush cb during the cleaning of the cleaning brush cb and the configuration for performing the positioning operation of the cleaning brush cb during the cleaning of the lower surface of the substrate W. Therefore, increases in number and size of components of the substrate cleaning device 700 can be inhibited.

(c) In the substrate cleaning device 700, the lower surface of the substrate W is polished by the substrate polishing mechanism 400. Thus, contaminants firmly adhering to the lower surface of the substrate W are removed. Thereafter, the lower surface of the substrate W is cleaned by the substrate cleaning mechanism 500. Thus, contaminants generated by the polishing of the lower surface of the substrate W are removed. Therefore, cleanliness of the lower surface of the substrate W can be more sufficiently improved.

(d) In the substrate processing apparatus 100, the lower surface of the substrate W on which the exposure processing has not been performed is polished and cleaned by the substrate cleaning device 700. Thus, the cleanliness of the lower surface of the substrate W during the exposure processing is improved. As a result, an occurrence of a processing defect of the substrate W due to the contamination of the lower surface of the substrate W is inhibited.

(13) Other Embodiments (a) While the plurality of auxiliary pins 290 are provided at the spin chuck 200 of the substrate cleaning device 700 in the above-mentioned embodiment, the plurality of auxiliary pins 290 do not have to be provided. In this case, the number of components of the spin chuck 200 is decreased, and the configuration of the spin chuck 200 is simplified. Further, each chuck pin 220 is locally brought into the opened state in a region corresponding to the magnet plate 232A of FIG. 9, whereby the polishing head ph can be brought into contact with the outer peripheral end WE of the substrate W while not interfering with another member. Thus, the outer peripheral end WE (FIG. 7) of the substrate W can be polished. Further, each chuck pin 220 is locally brought into the opened state in a region corresponding to the magnet plate 232B of FIG. 9, whereby the cleaning brush cb can be brought into contact with the outer peripheral end WE of the substrate W while not interfering with another member. Thus, the outer peripheral end WE (FIG. 7) of the substrate W can be cleaned.

(b) While the substrate polishing mechanism 400 that polishes the lower surface of the substrate W and the substrate cleaning mechanism 500 that cleans the lower surface of the substrate W are provided in the substrate cleaning device 700 in the above-mentioned embodiment, the present invention is not limited to this. Similarly to the cleaning drying processing unit SD2, the substrate polishing mechanism 400 does not have to be provided in the substrate cleaning device 700. In this case, the configuration of the substrate cleaning device 700 is simplified.

Alternatively, a new substrate cleaning mechanism 500 may be provided in the substrate cleaning device 700 instead of the substrate polishing mechanism 400. That is, two substrate cleaning mechanisms 500 may be provided in the substrate cleaning device 700. In this case, a pushing force exerted on the substrate W from each cleaning brush cb of each of the two substrate cleaning mechanisms 500, a moving speed of each cleaning brush cb on the lower surface of the substrate W and the like are adjusted, whereby the lower surface of the substrate W can be cleaned under two types of cleaning conditions. Thus, the substrate W to be processed can be cleaned accordingly.

As described above, in the case where a plurality of substrate cleaning mechanisms 500 are provided in the substrate cleaning device 700, a plurality of brush cleaning mechanisms 600 respectively corresponding to the plurality of substrate cleaning mechanisms 500 are provided. Thus, the cleaning brush cb of each substrate cleaning mechanism 500 can be maintained clean. Ranges in which the cleaning brushes cb of the plurality of substrate cleaning mechanisms 500 can be moved are respectively widened, whereby one brush cleaning mechanism 600 that can be commonly used for the cleaning brushes cb of the plurality of substrate cleaning mechanisms 500 may be provided.

(c) While pure water is used as the cleaning liquid supplied to the cleaning brush cb during the cleaning of the cleaning brush cb in the above-mentioned embodiment, a chemical liquid such as BHF (Buffered Hydrofluoric Acid), DHF (Dilute Hydrofluoric Acid), Hydrofluoric Acid, Hydrochloric Acid, Sulfuric Acid, Nitric Acid, Phosphoric Acid, Acetic Acid, Oxalic Acid, Ammonia or the like may be used as the cleaning liquid instead of pure water. More specifically, a mixed solution of ammonia water and hydrogen peroxide water may be used as the cleaning liquid, and an alkaline solution such as TMAH (Tetramethylammonium hydroxide) may be used as the cleaning liquid.

(d) In the above-mentioned embodiment, the cleaning brush cb is moved by the arm 510, the arm lifting lowering driver 530 and the arm rotation driver 540 in the casing 710 while being cleaned. Thus, the cleaning brush cb is moved relative to the space forming member 620, and the cleaning brush cb is appropriately positioned. However, the present invention is not limited to this.

Instead of being switched between the closed state where the cleaning brush cb closes the circular opening 624 and the opened state where the cleaning brush cb opens the circular opening 624 by the movement of the cleaning brush cb, the circular opening 624 may be switched between the closed state and the opened state by the movement of the space forming member 620. In this case, it is necessary to provide a moving mechanism for moving the space forming member 620 in the substrate cleaning device 700 in addition to the above-mentioned configuration.

(e) While the arm 510, the arm lifting lowering driver 530 and the arm rotation driver 540 perform the positioning operation of the cleaning brush cb during the cleaning of the cleaning brush cb and performs the positioning operation of the cleaning brush cb during the cleaning of the lower surface of the substrate W in the above-mentioned substrate cleaning device 700, the present invention is not limited to this. In the substrate cleaning device 700, the configuration for performing the positioning operation of the cleaning brush cb during the cleaning of the cleaning brush cb and the configuration for performing the positioning operation of the cleaning brush cb during the cleaning of the lower surface of the substrate W may be independently provided.

(f) While the exposure device 15 that performs the exposure processing for the substrate W by a liquid immersion method is provided as an external device of the substrate processing apparatus 100 in the above-mentioned embodiment, the present invention is not limited to this. The exposure device that performs the exposure processing for the substrate W with no liquid may be provided as the external device of the substrate processing apparatus 100. In this case, in the coating processing unit 129 in each of the coating processing chambers 32, 34, the resist cover film does not have to be formed on the substrate W. Therefore, the coating processing chambers 32, 34 can be used as development processing chambers.

(g) While the substrate processing apparatus 100 according to the above-mentioned embodiment is a substrate processing apparatus (so-called coater and developer) that performs the coating forming processing of the resist film and the development processing on the substrate W, the substrate processing apparatus provided with the substrate cleaning device 700 is not limited to the above-mentioned example. The present invention may be applied to a substrate processing apparatus that performs single processing such as cleaning processing on the substrate W. For example, the substrate processing apparatus according to the present invention may be constituted by an indexer block that includes a transport device, a substrate platform and the like, and one or a plurality of substrate cleaning devices 700.

(h) While the polishing head ph of the substrate polishing mechanism 400 is not cleaned in the above-mentioned substrate cleaning device 700, the present invention is not limited to this. In the substrate cleaning device 700, a configuration similar to that of the brush cleaning mechanism 600 may be provided at a position further upward than the substrate polishing mechanism 400 to be opposite to the polishing head ph located at the head waiting position p1. Thus, similarly to the cleaning brush cb, the cleaning processing for the upper end surface of the polishing head ph may be performed before the polishing of the lower surface of the substrate W, after the polishing of the lower surface of the substrate W or at another time point.

(14) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the substrate cleaning device 700 and the cleaning drying processing unit SD2 are examples of a substrate cleaning device, the spin chuck 200 is an example of a rotation holder, the cleaning brush cb is an example of a cleaner, the substrate cleaning mechanism 500 is an example of a lower surface cleaning mechanism, and the brush cleaning mechanism 600 is an example of a cleaner cleaning mechanism.

Further, the space forming member 620 is an example of a space forming member, the lower end surface 623 of the space forming member 620 is an example of a lower end surface, the circular opening 624 of the space forming member 620 is an example of a circular opening, the inner space 625 of the space forming member 620 is an example of an inner space, and the cleaning liquid introduction pipe 630 and the fluid supply system 98 are examples of a cleaning liquid supply system.

Further, the rotation support shaft 514, the pulleys 515, 517, the belt 516 and the motor 518 in the arm 510 are examples of a cleaner rotator, the arm 510, the arm lifting lowering driver 530 and the arm rotation driver 540 are examples of a relative mover, the brush waiting position p2 is an example of a waiting position, and the position at which the cleaning brush cb is opposite to the lower surface of the substrate W held by the spin chuck 200 is an example of a cleaning position.

Further, the polishing head ph is an example of a polisher, the substrate polishing mechanism 400 is an example of a lower surface polishing mechanism, the exposure device 15 is an example of an exposure device, the substrate processing apparatus 100 is an example of a substrate processing apparatus, the coating processing unit 129 that supplies the processing liquid for the resist film to the substrate W is an example of a coating device, and the transport devices 115, 127, 128, 137, 138, 141, 142, 146 are examples of a transport device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for a cleaning device that cleans a lower surface of a substrate.

We claim:
1. A substrate cleaning device that cleans a lower surface of a substrate, comprising:
   a rotation holder that holds and rotates the substrate in a horizontal attitude;
   a lower surface cleaning mechanism that includes a cleaner having a circular upper end surface and cleans the lower surface of the substrate by bringing the upper end surface of the cleaner into contact with the lower surface of the substrate rotated by the rotation holder; and
   a cleaner cleaning mechanism that cleans the cleaner, wherein
   the cleaner cleaning mechanism includes
   a space forming member that has a lower end surface, has a circular opening in the lower end surface and forms an inner space, and
   a cleaning liquid supply system that allows a cleaning liquid to flow out from the inner space through the circular opening and a gap between the upper end surface of the cleaner and the lower end surface of the space forming member by supplying the cleaning liquid to the inner space of the space forming member with the circular opening of the space forming member closed by the upper end surface of the cleaner.
2. The substrate cleaning device according to claim 1, wherein
   the lower end surface of the space forming member is inclined downward and outward from an inner edge of the circular opening.

3. The substrate cleaning device according to claim 1, further comprising a cleaner rotator that rotates the cleaner relative to the space forming member about a vertical axis passing through the upper end surface with the circular opening of the space forming member closed by the upper end surface of the cleaner.

4. The substrate cleaning device according to claim 1, further comprising a relative mover that moves the cleaner relative to the space forming member such that the upper end surface of the cleaner closes the circular opening of the space forming member.

5. The substrate cleaning device according to claim 4, wherein
- the cleaner cleaning mechanism is provided at a waiting position outward of the substrate rotated by the rotation holder, and
- the relative mover, during cleaning of the lower surface of the substrate, is configured to be capable of moving the cleaner between a cleaning position at which the upper end surface of the cleaner faces the lower surface of the substrate rotated by the rotation holder and the waiting position, and is configured to be capable of moving the cleaner relative to the substrate rotated by the rotation holder such that the upper end surface of the cleaner comes into contact with the lower surface of the substrate rotated by the rotation holder at the cleaning position.

6. The substrate cleaning device according to claim 1, further comprising a lower surface polishing mechanism that includes a polisher and polishes the lower surface of the substrate by bringing the polisher into contact with the lower surface of the substrate rotated by the rotation holder, wherein
- the lower surface cleaning mechanism cleans the lower surface of the substrate after polishing of the lower surface of the substrate by the lower surface polishing mechanism.

7. A substrate processing apparatus arranged to be adjacent to an exposure device, comprising:
- a coating device that applies a photosensitive film to an upper surface of a substrate;
- the substrate cleaning device according to claim 1; and
- a transport device that transports the substrate among the coating device, the substrate cleaning device and the exposure device, wherein
- the substrate cleaning device cleans a lower surface of the substrate before exposure processing for the substrate by the exposure device.

* * * * *